United States Patent
Song et al.

(10) Patent No.: US 11,016,348 B2
(45) Date of Patent: May 25, 2021

(54) DISPLAY PANEL

(71) Applicant: Samsung Display Co., Ltd., Yongin-si (KR)

(72) Inventors: Seungki Song, Yongin-si (KR); Chansol Yoo, Seoul (KR); Jinjoo Ha, Hwaseong-si (KR); Joonhyeong Kim, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/922,998

(22) Filed: Jul. 7, 2020

(65) Prior Publication Data

US 2020/0333671 A1    Oct. 22, 2020

Related U.S. Application Data

(63) Continuation of application No. 16/139,390, filed on Sep. 24, 2018, now Pat. No. 10,725,348.

(30) Foreign Application Priority Data

Sep. 25, 2017    (KR) .................. 10-2017-0123750

(51) Int. Cl.
*G02F 1/1343* (2006.01)
*G02F 1/1345* (2006.01)
(Continued)

(52) U.S. Cl.
CPC ...... *G02F 1/134309* (2013.01); *G02F 1/1339* (2013.01); *G02F 1/13452* (2013.01);
(Continued)

(58) Field of Classification Search
CPC .. G02F 1/1339; G02F 1/1345; G02F 1/13452; G02F 1/13454
See application file for complete search history.

(56) References Cited

U.S. PATENT DOCUMENTS 5,029,984 A   7/1991   Adachi et al.
5,293,262 A   3/1994   Adachi et al.
(Continued)

FOREIGN PATENT DOCUMENTS

EP   3112931        1/2017
JP   2003-186022    7/2003
(Continued)

OTHER PUBLICATIONS

Extended European Search Report dated Dec. 20, 2018, in European Patent Application No. 18195377.9.
(Continued)

*Primary Examiner* — James A Dudek
(74) *Attorney, Agent, or Firm* — H.C. Park & Associates, PLC

(57) ABSTRACT

A display panel includes: a first substrate having a top surface and a side surface, the top surface including a display area and a non-display area outside the display area; a second substrate facing the first substrate; a first insulating structure disposed between the second substrate and the first substrate, wherein the first insulating structure overlaps the non-display area without overlapping the display area; a pixel disposed between the first substrate and the second substrate and overlapping the display area; a signal line having a side surface substantially aligned with the side surface of the first substrate, wherein the signal line is disposed on the first substrate; a second insulating structure overlapping the signal line and disposed between the first substrate and the first insulating structure, wherein the second insulating structure has a side surface substantially aligned with the side surface of the first substrate; and a connection pad being in contact with the side surface of the signal line. The second insulating structure includes an
(Continued)

organic pattern overlapping the non-display area without overlapping the display area.

19 Claims, 18 Drawing Sheets

(51) Int. Cl.
    *H01L 27/32*     (2006.01)
    *G02F 1/1335*     (2006.01)
    *G02F 1/1339*     (2006.01)
    *G02F 1/1362*     (2006.01)
    *G09G 3/3208*     (2016.01)
    *G09G 3/36*     (2006.01)
    *H01L 27/12*     (2006.01)
    *G02F 1/1333*     (2006.01)

(52) U.S. Cl.
    CPC .. *G02F 1/133514* (2013.01); *G02F 1/136286* (2013.01); *G09G 3/3208* (2013.01); *G09G 3/36* (2013.01); *H01L 27/124* (2013.01); *H01L 27/3251* (2013.01); *H01L 27/3276* (2013.01); *G02F 1/133351* (2013.01); *G09G 2300/0426* (2013.01); *H01L 27/3246* (2013.01)

(56) References Cited

U.S. PATENT DOCUMENTS

| | | | |
|---|---|---|---|
| 6,587,175 B1 | 7/2003 | Ruedin et al. | |
| 9,123,593 B2 | 9/2015 | Kang et al. | |
| 9,366,929 B2 | 6/2016 | Kang et al. | |
| 9,496,323 B2 | 11/2016 | Jung et al. | |
| 9,632,381 B2 | 4/2017 | Kang et al. | |
| 2013/0009194 A1* | 1/2013 | Yamazaki | G02F 1/1368 257/99 |
| 2014/0176863 A1 | 6/2014 | Oohira | |
| 2015/0062524 A1* | 3/2015 | Kim | G02F 1/1339 349/153 |
| 2015/0145791 A1* | 5/2015 | Kim | G06F 3/041 345/173 |
| 2015/0185516 A1* | 7/2015 | Lee | G02F 1/1339 349/110 |
| 2016/0077376 A1* | 3/2016 | Lee | G02F 1/1339 349/106 |
| 2016/0377905 A1* | 12/2016 | Choi | G02F 1/1339 257/72 |
| 2017/0059926 A1 | 3/2017 | Kim | |
| 2017/0082900 A1 | 3/2017 | Kong et al. | |
| 2017/0358602 A1 | 12/2017 | Bae et al. | |
| 2018/0017826 A1 | 1/2018 | Seo et al. | |
| 2018/0173033 A1* | 6/2018 | Suga | G02F 1/13452 |
| 2018/0307084 A1 | 10/2018 | Lee et al. | |

FOREIGN PATENT DOCUMENTS

| | | |
|---|---|---|
| JP | 5454872 | 3/2014 |
| KR | 10-2008-0108743 | 12/2008 |
| KR | 10-1010082 | 1/2011 |
| KR | 10-2014-0136233 | 11/2014 |
| KR | 10-2014-0136237 | 11/2014 |
| KR | 10-2014-0136238 | 11/2014 |
| KR | 10-2015-0033158 | 4/2015 |
| KR | 10-2015-0047711 | 5/2015 |
| KR | 10-2015-0074275 | 7/2015 |
| KR | 10-2016-0028550 | 3/2016 |
| KR | 10-2017-0002283 | 1/2017 |
| KR | 10-2017-0139211 | 12/2017 |

OTHER PUBLICATIONS

Non-Final Office Action dated Aug. 22, 2019, issued in U.S. Appl. No. 16/139,390.

Final Office Action dated Dec. 17, 2019, issued in U.S. Appl. No. 16/139,390.

Notice of Allowance dated Mar. 25, 2020, issued in U.S. Appl. No. 16/139,390.

\* cited by examiner

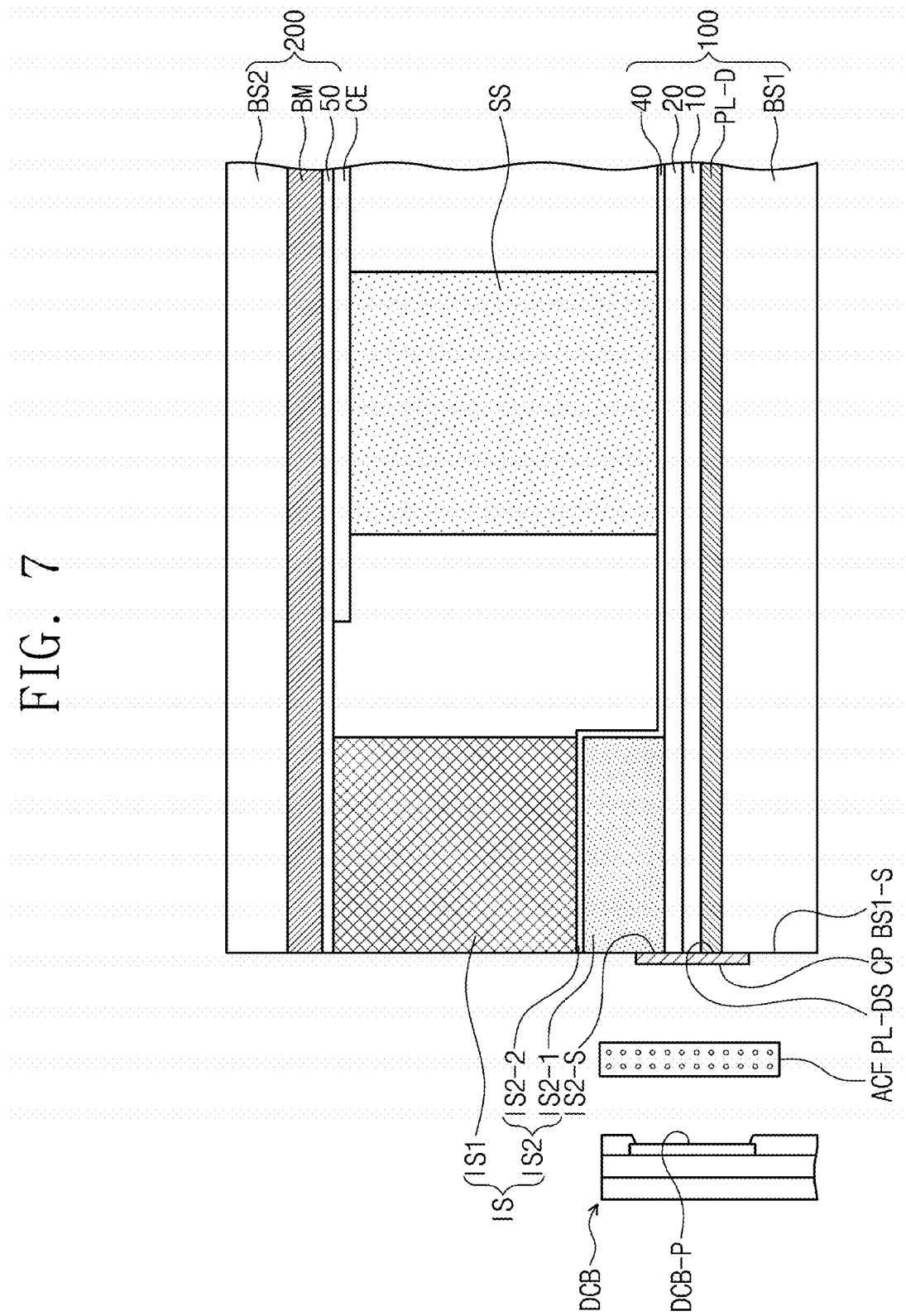

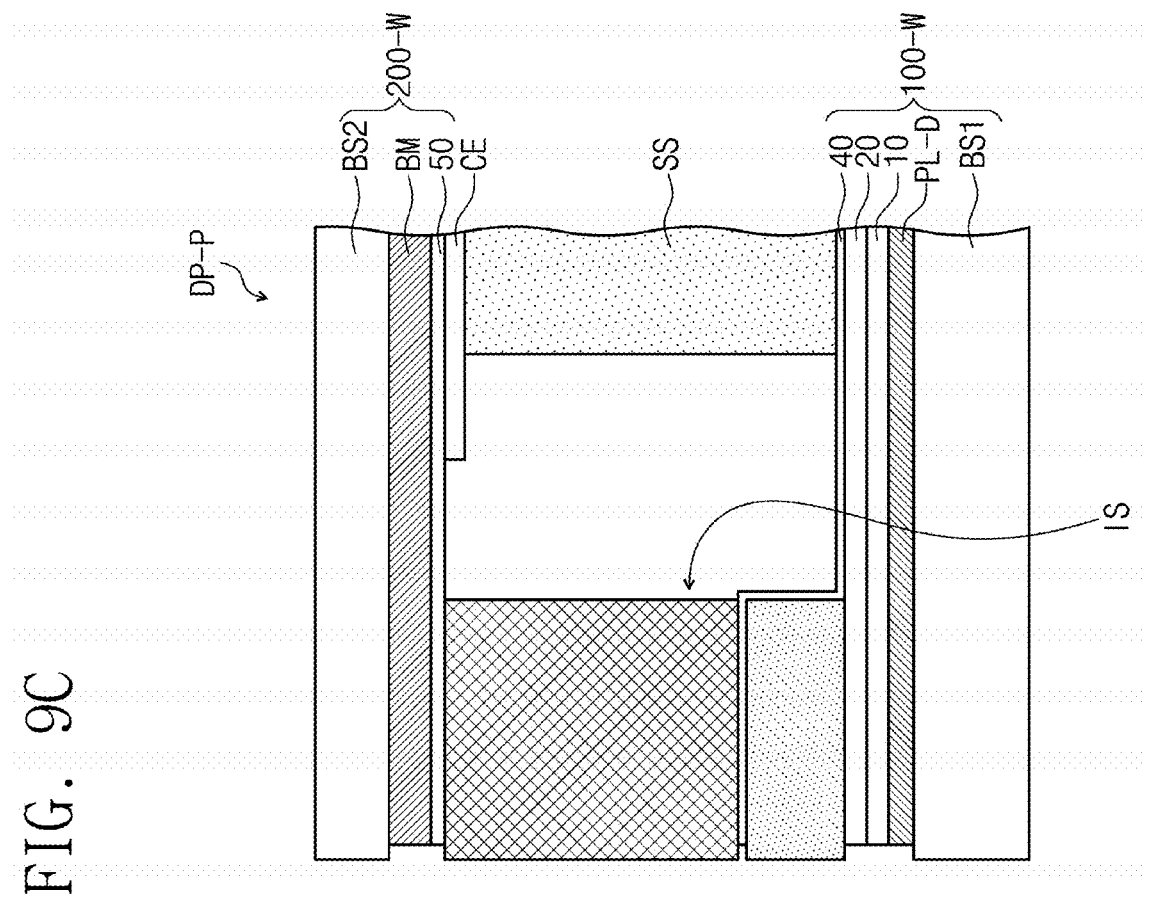
FIG. 9C
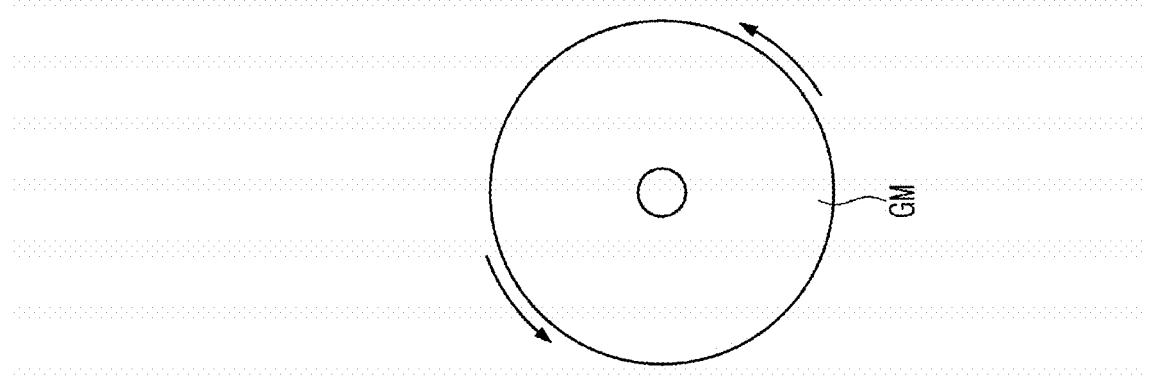

DISPLAY PANEL

CROSS-REFERENCE TO RELATED APPLICATIONS

This U.S. non-provisional patent application is a Continuation of U.S. patent application Ser. No. 16/139,390, filed Sep. 24, 2018, which claims priority to and the benefit of Korean Patent Application No. 10-2017-0123750, filed on Sep. 25, 2017, which is hereby incorporated by reference for all purposes as if fully set forth herein.

BACKGROUND

Field

Exemplary embodiments of the invention relate generally to a display panel and, more specifically, to a display panel having a sturdy structure and large viewing area.

Discussion of the Background

Generally, after a display panel is manufactured, a printed circuit board (PCB) is connected to the display panel. For example, in a tape automated bonding (TAB) mounting method, the PCB is bonded to the display panel using an anisotropic conductive film (ACF). Typically, the PCB has a planar shape that extends from the display panel in a direction generally parallel to the display panel after connection, which increases the overall dimensions of the display panel.

Recently, display panel design techniques for reducing a bezel area (or a non-display area) have been variously studied.

The above information disclosed in this Background section is only for understanding of the background of the inventive concepts, and, therefore, it may contain information that does not constitute prior art.

SUMMARY

Display panels constructed according to exemplary embodiments of the invention have a PCB that connects to a side surface of a display panel, which may improve structural integrity and provide a more compact configuration that reduces the non-display area and/or improve the electrical connection between the PCB and a signal line, and may prevent the signal line from being damaged and/or deformed in a manufacturing process such as a grinding process.

Additional features of the inventive concepts will be set forth in the description which follows, and in part will be apparent from the description, or may be learned by practice of the inventive concepts.

According to one or more exemplary embodiments of the invention, a display panel includes a first substrate having a top surface and a side surface extending in a direction intersecting the top surface, a second substrate facing the first substrate, an insulating layer disposed between the first substrate and the second substrate, a first insulating structure disposed between the insulating layer and the first substrate, a pixel disposed between the first substrate and the second substrate, a signal line having a side surface substantially aligned with the side surface of the first substrate, a second insulating structure overlapping the signal line and being in contact with the first insulating structure, and a connection pad being in contact with the side surface of the first substrate, the side surface of the signal line, and the side surface of the second insulating structure. The first insulating structure is in contact with the insulating layer, the signal line is disposed on the first substrate, and the second insulating structure has a side surface substantially aligned with the side surface of the first substrate.

The second insulating structure may include an organic layer overlapping the signal line, and an inorganic layer disposed on the organic layer.

The pixel may include a first electrode, a second electrode insulated from the first electrode, a thin film transistor electrically connected to the first electrode, and a liquid crystal layer controlled by an electric field formed between the first electrode and the second electrode.

The display panel may further include a spacer overlapping the thin film transistor. The first electrode and the second electrode may overlap each other and may be spaced apart from each other in a thickness direction of the first substrate, the inorganic layer may extend to overlap the thin film transistor, the second electrode may overlap the thin film transistor, and the spacer may be disposed between a portion of the inorganic layer overlapping the thin film transistor and a portion of the second electrode overlapping the thin film transistor.

The first insulating structure and the spacer may include substantially the same material.

The display panel may further include a color filter disposed between the first substrate and the first electrode and overlapping the first electrode.

The inorganic layer may extend to overlap the color filter and is in contact with the color filter.

The organic layer and the color filter may include substantially the same material.

The signal line may be disposed on substantially the same layer as a control electrode of the thin film transistor.

The display panel may further include a seal spaced apart from the organic layer of the second insulating structure. The seal may surround the liquid crystal layer.

The display may further include a floating electrode overlapping the signal line and the second insulating structure. The floating electrode may be disposed between the signal line and the organic layer of the second insulating structure.

The floating electrode may be disposed on substantially the same layer as an input electrode or an output electrode of the thin film transistor.

The display panel may further include a circuit substrate electrically connected to the connection pad.

The pixel may include a first electrode, a second electrode insulated from the first electrode, a thin film transistor electrically connected to the first electrode, and a light emitting layer disposed between the first electrode and the second electrode.

The signal line may include copper, and the connection pad may include silver paste.

According to one or more exemplary embodiments of the invention, a display panel includes a first substrate having a top surface and a side surface extending in a direction intersecting the top surface, a second substrate facing the first substrate, electrodes disposed between the first substrate and the second substrate, a liquid crystal layer disposed between the first substrate and the second substrate, a sealing structure disposed between the first substrate and the second substrate and configured to surround the liquid crystal layer, an insulating structure disposed between the first substrate and the second substrate and disposed outside of the sealing structure, a signal line having a side surface substantially aligned with the side surface of the first substrate, and a connection pad being in contact with the side surface of the first substrate, the side surface of the signal line, and the side surface of the insulating structure. The insulating structure has a side surface substantially aligned with the side surface of the first substrate and includes layers different from that of the sealing structure. The signal line is disposed on the first substrate and overlaps the insulating structure, The insulating structure may surround the sealing structure.

The sealing structure may have a single-layered structure, and the insulating structure may include at least two stacked, organic layers.

The insulating structure may further include an inorganic layer disposed between the two organic layers.

The electrodes may include a first electrode and a second electrode spaced apart from each other, the liquid crystal layer may be disposed between the first electrode and the second electrode, the sealing structure may be in contact with one of the first electrode and the second electrode, and the insulating structure may be spaced apart from the first electrode and the second electrode.

According to one or more exemplary embodiments of the invention, a display panel includes: a first substrate having a top surface and a side surface, the top surface including a display area and a non-display area outside the display area; a second substrate facing the first substrate; a first insulating structure disposed between the second substrate and the first substrate, wherein the first insulating structure overlaps the non-display area without overlapping the display area; a pixel disposed between the first substrate and the second substrate and overlapping the display area; a signal line having a side surface substantially aligned with the side surface of the first substrate, wherein the signal line is disposed on the first substrate; a second insulating structure overlapping the signal line and disposed between the first substrate and the first insulating structure, wherein the second insulating structure has a side surface substantially aligned with the side surface of the first substrate; and a connection pad being in contact with the side surface of the signal line. The second insulating structure includes an organic pattern overlapping the non-display area without overlapping the display area.

The second insulating structure may include an organic layer overlapping the signal line; and an inorganic layer disposed on the organic layer.

The pixel may include a thin film transistor; and a display element electrically connected to the thin film transistor.

The display panel may further include a spacer overlapping the thin film transistor. The display element may include a first electrode, a second electrode, and a display layer disposed between the first electrode and the second electrode. The first electrode and the second electrode may overlap each other and may be spaced apart from each other in a thickness direction of the first substrate, the inorganic layer may extend to overlap the thin film transistor, the second electrode may overlap the thin film transistor, and the spacer may be disposed between a portion of the inorganic layer overlapping the thin film transistor and a portion of the second electrode overlapping the thin film transistor.

The first insulating structure and the spacer may have substantially the same material.

The display panel may further include a color filter disposed between the first substrate and the first electrode and overlapping the first electrode.

The inorganic layer may extend to overlap the color filter and is in contact with the color filter.

The organic layer and the color filter may have substantially the same material.

The signal line may be disposed on substantially the same layer as a control electrode of the thin film transistor.

The display panel may further include a seal disposed between the first substrate and the second substrate and spaced apart from the organic layer of the second insulating structure.

The display panel may further include a floating electrode overlapping the signal line and the second insulating structure. The floating electrode may be disposed between the signal line and the organic layer of the second insulating structure.

The floating electrode may be disposed on substantially the same layer as an input electrode or an output electrode of the thin film transistor.

The display element may include: a first electrode; a second electrode insulated from the first electrode; and a light emitting layer disposed between the first electrode and the second electrode.

The display panel may further include a circuit substrate electrically connected to the connection pad.

The signal line may include copper, and the connection pad may include silver paste.

The display panel may further include an insulating layer disposed between the first insulating structure and the second substrate and non-overlapping the display area and the non-display area.

The first insulating structure may contact the insulating layer.

The second insulating structure may contact the first insulating structure.

The connection pad may contact the side surface of the first substrate and the side surface of the second insulating structure.

According to one or more exemplary embodiments of the invention of the invention, a display panel includes: a first substrate having a top surface and a side surface; a second substrate facing the first substrate; electrodes disposed between the first substrate and the second substrate; a display layer disposed between the first substrate and the second substrate; a sealing structure disposed between the first substrate and the second substrate; an insulating structure disposed between the first substrate and the second substrate. The insulating structure has a side surface substantially aligned with the side surface of the first substrate and includes layers different from that of the sealing structure; a signal line having a side surface substantially aligned with the side surface of the first substrate. The signal line is disposed on the first substrate and overlaps the insulating structure; and a connection pad is in contact with the side surface of the signal line. The insulating structure is disposed outside of the sealing structure in a plan view and without overlapping the sealing structure in a plan view.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 7 is a schematic cross-sectional view of a non-display area of a display panel constructed according to an embodiment of the invention.

FIG. 9C is a schematic cross-sectional view of a preliminary display panel cut from the work panel of FIG. 9A.

DETAILED DESCRIPTION

Figure 1:
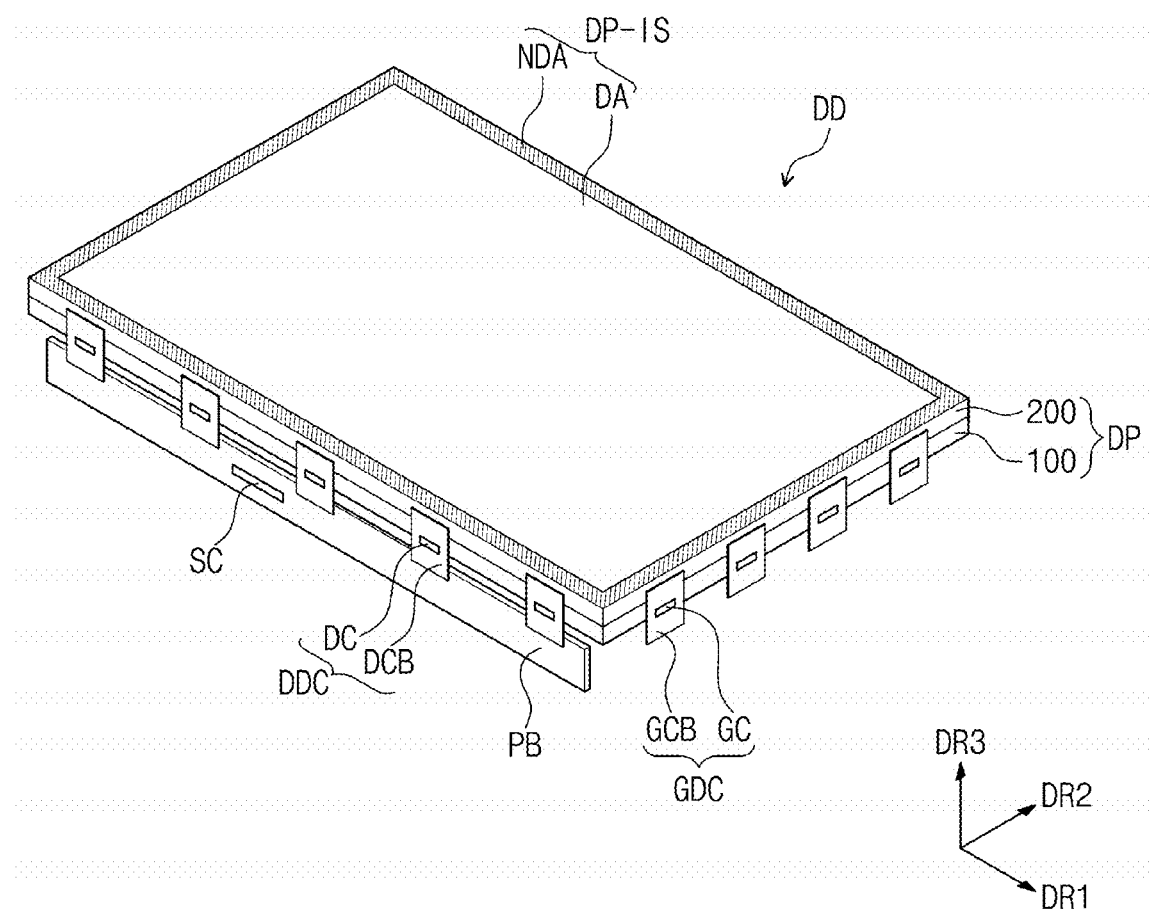
FIG. 1 is a schematic perspective view of an exemplary embodiment of a display device constructed according to the principles of the invention.

In the following description, for the purposes of explanation, numerous specific details are set forth in order to provide a thorough understanding of various exemplary embodiments or implementations of implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
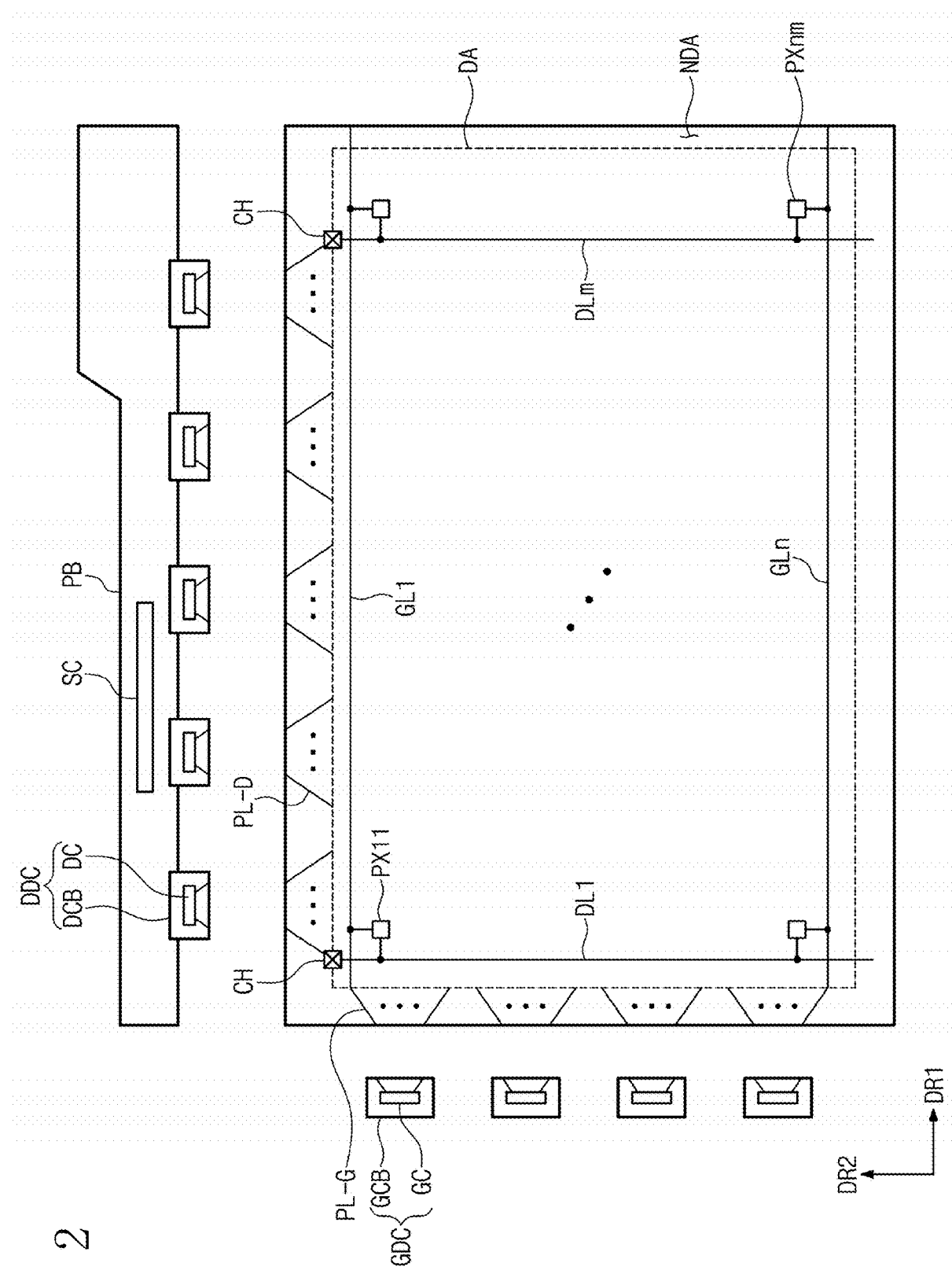
FIG. 2 is a schematic plan view of the display device of FIG. 1.
Figure 3:
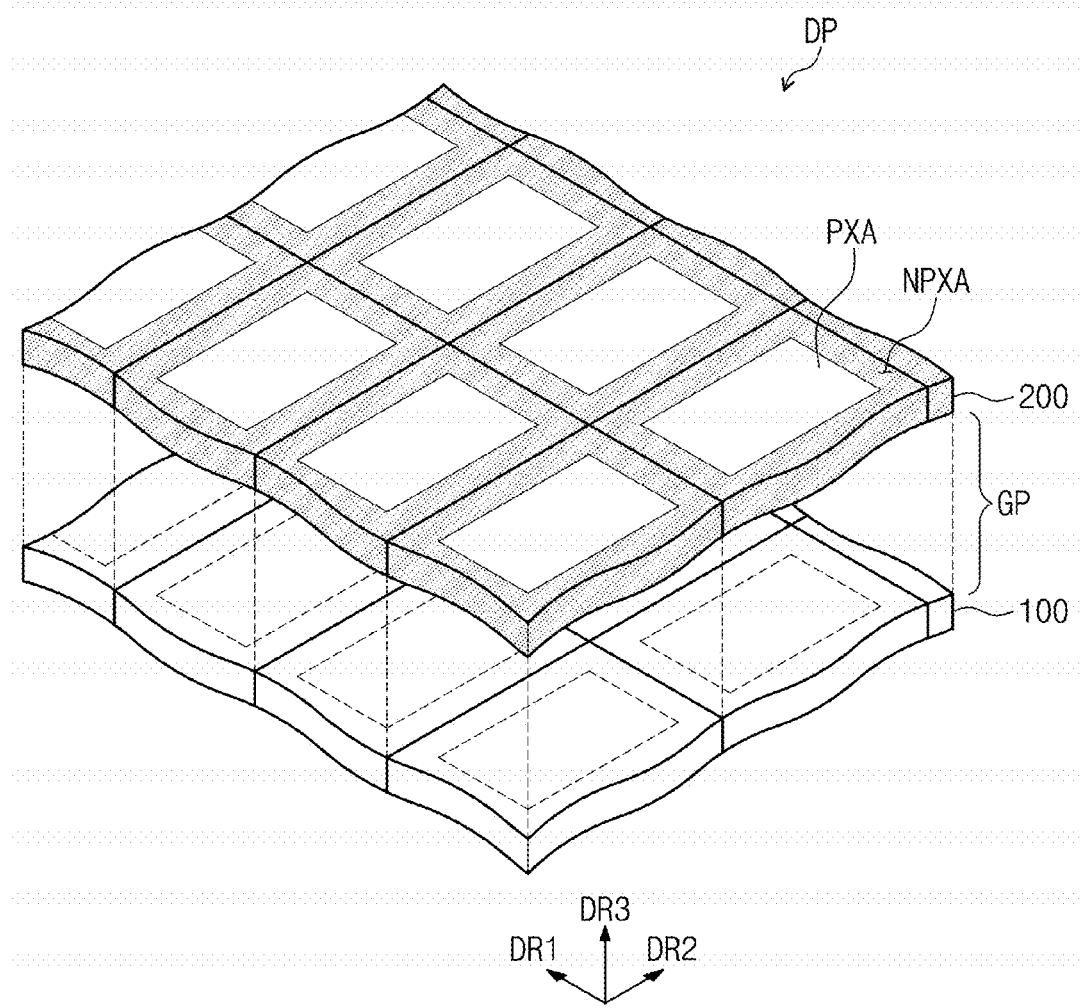
FIG. 3 is a schematic, partial perspective view of a display area of a display panel of the display device of FIG. 1.
Figure 4:
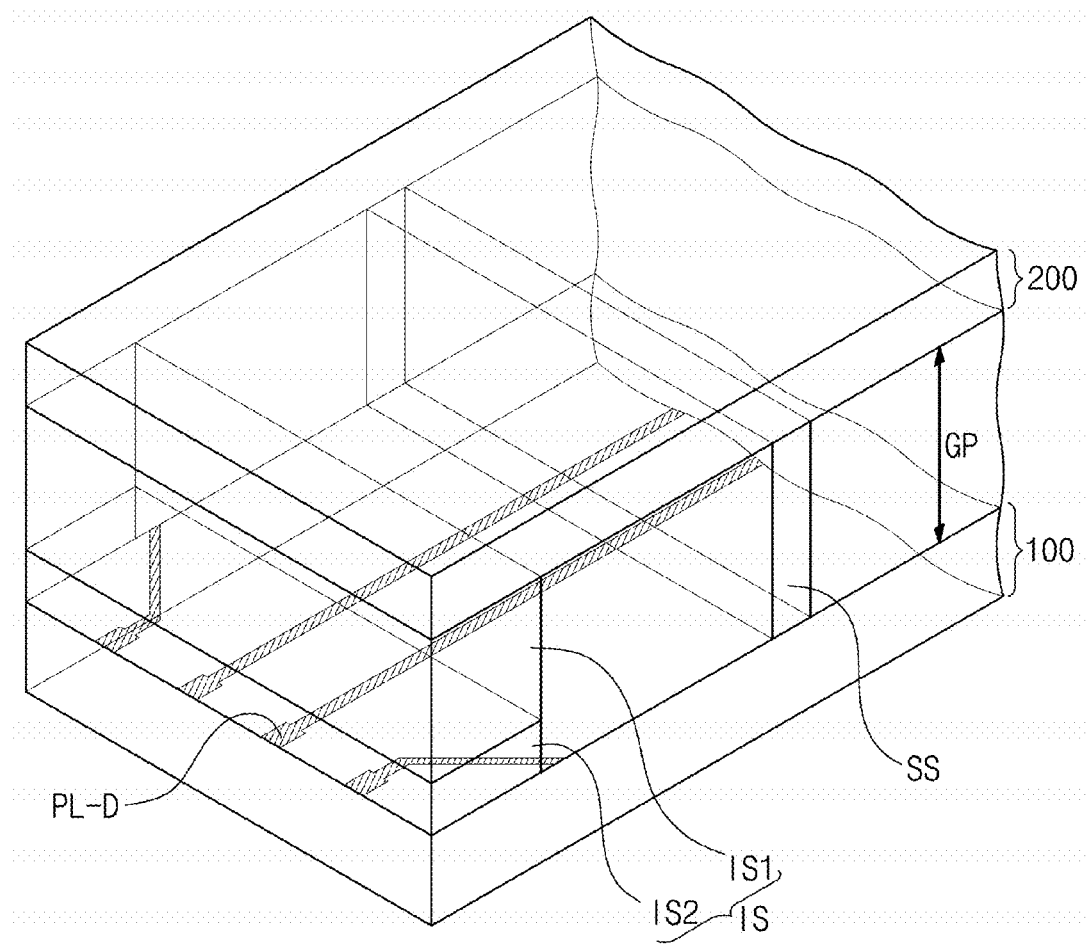
FIG. 4 is a schematic, partial perspective view of a non-display area of a display panel of the display device of FIG. 1.

FIG. 1 is a schematic perspective view of an exemplary embodiment of a display device constructed according to the principles of the invention. FIG. 2 is a schematic plan view of the display device of FIG. 1. FIG. 3 is a schematic, partial perspective view of a display area of a display panel of the display device of FIG. 1. FIG. 4 is a schematic, partial perspective view of a non-display area of a display panel of the display device of FIG. 1.

Referring to FIGS. 1 and 2, display device DD includes display panel DP, gate driving unit GDC, data driving unit DDC, main circuit substrate PB, and signal controller SC. Display device DD may further include a chassis member or a molding member and may further include a backlight unit depending on the type of display panel DP employed.

Display panel DP may be formed as a liquid crystal display panel, a plasma display panel, an electrophoretic display panel, a microelectromechanical system (MEMS) display panel, an electrowetting display panel, or other types of display panels known in the art.

Display panel DP may include first display substrate 100 and second display substrate 200 disposed on first display substrate 100. Even though not visible in FIG. 1, a gap may be formed between first display substrate 100 and second display substrate 200.

As illustrated in FIG. 1, display panel DP may display an image through display surface DP-IS. Display surface DP-IS is parallel to a plane defined by first directional axis DR1 and second directional axis DR2. Display surface DP-IS may include display area DA and non-display area NDA. Non-display area NDA may be defined along a border of display surface DP-IS and may surround display area DA.

A normal direction of display surface DP-IS (i.e., a thickness direction of display panel DP) is indicated by third directional axis DR3. Hereinafter, a front surface (or a top surface) and a back surface (or a bottom surface) of each of layers or units may have a thickness defined in a third directional axis DR3. However, first, second and third directional axes DR1, DR2 and DR3 shown in the illustrated embodiment are examples of the invention, and first, second and third directional axes DR1, DR2 and DR3 may be relative concepts and may be changed to other directions. Hereinafter, the first, second and third directions are the directions indicated by first, second, and third directional axes DR1, DR2 and DR3, respectively, and are indicated by the same reference designators as first, second and third directional axes DR1, DR2, and DR3.

Display panel DP having a planar display surface is shown in the illustrated embodiment. However, the inventive concepts are not limited thereto. In certain embodiments, display panel DP may include a curved display surface or a three-dimensional (3D) display surface. A 3D display surface may include a plurality of display areas indicated by different directions.

Gate driving unit GDC and data driving unit DDC may include circuit substrates GCB and DCB, which may be formed as printed circuit boards (PCBs) and driving chips GC and DC, respectively. Each of circuit substrates GCB and DCB has a structure in which an insulating layer and a conductive layer are stacked. The conductive layer may include a plurality of signal lines. Gate driving unit GDC and data driving unit DDC may be coupled to a side surface of display panel DP so as to be electrically connected to signal lines of display panel DP and have planar shapes defined by second and third directions DR2 and DR3 that extend generally perpendicular to the plane of the display panel defined by first and second directions DR1 and DR2. Since gate driving unit GDC and data driving unit DDC are coupled to the side surface of display panel DP in this manner, non-display area NDA may be reduced, compared to the typical configuration in the planar shapes defined by the circuit substrates extended generally parallel to the plane of display surface DP-IS.

In the illustrated embodiment, gate driving unit GDC and data driving unit DDC are coupled to different side surfaces of display panel DP. However, the inventive concepts are not limited thereto. In another embodiment, one of gate driving unit GDC and data driving unit DDC may be omitted. In other embodiments, gate driving unit GDC and data driving unit DDC may be coupled to substantially the same side surface of display panel DP, or gate driving unit GDC may be integrated on display panel DP through an oxide silicon gate driver circuit (OSG) process or an amorphous silicon gate driver circuit (ASG) process.

Main circuit substrate PB may be connected to circuit substrate DCB of data driving unit DDC. Main circuit substrate PB may be electrically connected to circuit substrate DCB of data driving unit DDC through an anisotropic conductive film (ACF) or solder balls. Signal controller SC may be mounted on main circuit substrate PB. Signal controller SC receives image data and control signals from an external graphic controller. Signal controller SC may provide control signals to gate driving unit GDC and data driving unit DDC.

In an embodiment of the invention, display device DD may further include a main circuit substrate connected to circuit substrate GCB of gate driving unit GDC. In an embodiment of the invention, driving chip DC of data driving unit DDC may be mounted on main circuit substrate PB.

FIG. 2 illustrates planar arrangement of signal lines GL1 to GLn, DL1 to DLm, PL-G and PL-D and pixels PX11 to PXnm in display panel DP. Signal lines GL1 to GLn, DL1 to DLm, PL-G and PL-D may include a plurality of gate lines GL1 to GLn, a plurality of data lines DL1 to DLm, and auxiliary signal lines PL-G and PL-D.

Gate lines GL1 to GLn extend in first direction DR1 and are arranged in second direction DR2, and data lines DL1 to DLm are insulated from gate lines GL1 to GLn and intersect gate lines GL1 to GLn.

Gate lines GL1 to GLn and data lines DL1 to DLm overlap each other and are disposed in display area DA. Auxiliary signal lines PL-G and PL-D are disposed in non-display area NDA and connected to gate lines GL1 to GLn and data lines DL1 to DLm.

First auxiliary signal lines PL-G connected to gate lines GL1 to GLn may be disposed on substantially the same layer as gate lines GL1 to GLn and may constitute a single unitary body with gate lines GL1 to GLn. Second auxiliary signal lines PL-D connected to data lines DL1 to DLm may be disposed on a layer different from the layer on which data lines DL1 to DLm are disposed. Each of data lines DL1 to DLm may be electrically connected to a corresponding one of second auxiliary signal lines PL-D through contact hole CH penetrating at least one insulating layer disposed between second auxiliary signal lines PL-D and data lines DL1 to DLm.

In an embodiment of the invention, contact hole CH may be omitted, and data lines DL1 to DLm and second auxiliary signal lines PL-D may be disposed on substantially the same layer. In the illustrated embodiment, gate lines GL1 to GLn and first auxiliary signal lines PL-G are distinguished from each other. However, in another embodiment, a gate line and a first auxiliary signal line connected to each other may be defined as one signal line. In this case, the gate line and the first auxiliary signal line connected to each other may be defined as different portions of one signal line.

Signal lines GL1 to GLn, DL1 to DLm, PL-G and PL-D may further include other signal lines, such as signal lines for electrically connecting gate driving units GDC to one another and signal lines for electrically connecting gate driving units GDC to main circuit substrate PB.

Each of pixels PX11 to PXnm is connected to a corresponding one of gate lines GL1 to GLn and a corresponding one of data lines DL1 to DLm. Each of pixels PX11 to PXnm may include a pixel driving circuit and a display element.

Pixels PX11 to PXnm arranged in a matrix shape are illustrated as an example in FIG. 2. However, the inventive concepts are not limited thereto. In another embodiment, pixels PX11 to PXnm may be arranged in a pentile shape.

FIG. 3 illustrates a central portion of display area DA. Display area DA may include pixel areas PXA and peripheral area NPXA. Peripheral area NPXA may surround each of pixel areas PXA and may correspond to a boundary area between pixel areas PXA. Pixel areas PXA may be arranged in substantially the same shape as pixels PX11 to PXnm.

Pixel areas PXA may correspond to areas that substantially display colors. Pixel areas PXA may correspond to transmission areas in a transmission-type display panel or may correspond to light emitting areas in a light emitting display panel. Pixel areas PXA may be classified into a plurality of groups on the basis of colors displayed by pixel areas PXA. In other words, each of pixel areas PXA may display one of primary colors. The primary colors may include a red color, a green color, a blue color, and a white color.

Gap GP is defined between first display substrate 100 and second display substrate 200. Signal lines GL1 to GLn, DL1 to DLm, PL-G and PL-D described with reference to FIG. 2 may be included in one of first display substrate 100 and second display substrate 200. Pixels PX11 to PXnm may be included in one of first display substrate 100 and second display substrate 200. Alternatively, some components of pixels PX11 to PXnm may be included in first display substrate 100, and other components of pixel PX11 to PXnm may be included in second display substrate 200. Pixels PX11 to PXnm may be disposed between the base substrate of first display substrate 100 and the base substrate of second display substrate 200.

FIG. 4 illustrates a portion of non-display area NDA which may be connected to gate driving unit GDC and data driving unit DDC. A portion in which second auxiliary signal lines PL-D are disposed is illustrated in FIG. 4.

Insulating structure IS that has a side surface substantially aligned with the side surface of display panel DP may overlap second auxiliary signal lines PL-D. Insulating structure IS may have a multi-layered structure. Insulating structure IS having a two-layer structure is illustrated as an example in FIG. 4. One of first insulating structure IS1 and second insulating structure IS2 of insulating structure IS may correspond to a portion of one of first display substrate 100 and second display substrate 200.

Even though a portion of insulating structure IS is illustrated in FIG. 4, insulating structure IS may extend along an edge of display panel DP in a plan view and may have a closed loop shape in a plan view.

Sealing structure SS may further be disposed between first display substrate 100 and second display substrate 200. Sealing structure SS may be disposed inside insulating structure IS. In other words, sealing structure SS may be closer to display area DA than insulating structure IS. That is, sealing structure SS may be disposed between insulating structure IS and display area DA. Sealing structure SS may surround gap GP. In other words, first display substrate 100, second display substrate 200 and sealing structure SS may define a sealed space.

Sealing structure SS may have a structure different from that of insulating structure IS. Sealing structure SS may have a single-layered structure. Sealing structure SS may include a photocurable organic material, a thermosetting organic material, or a glass frit sealant.

Figure 5:
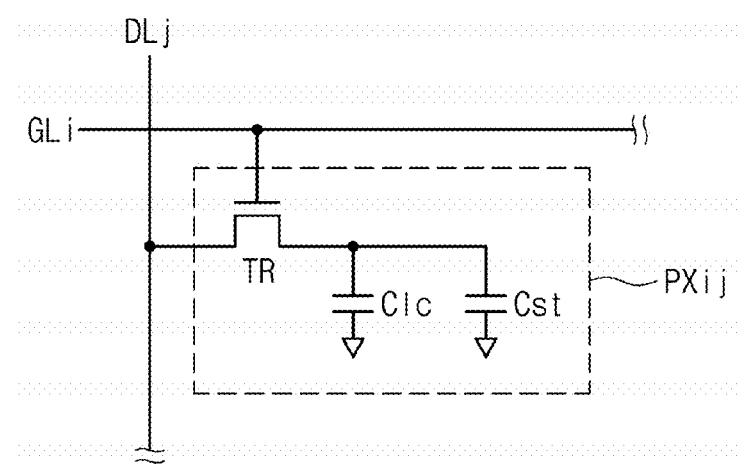
FIG. 5 is an equivalent circuit diagram of a pixel of a display panel of the display device of FIG. 2.
Figure 6A:
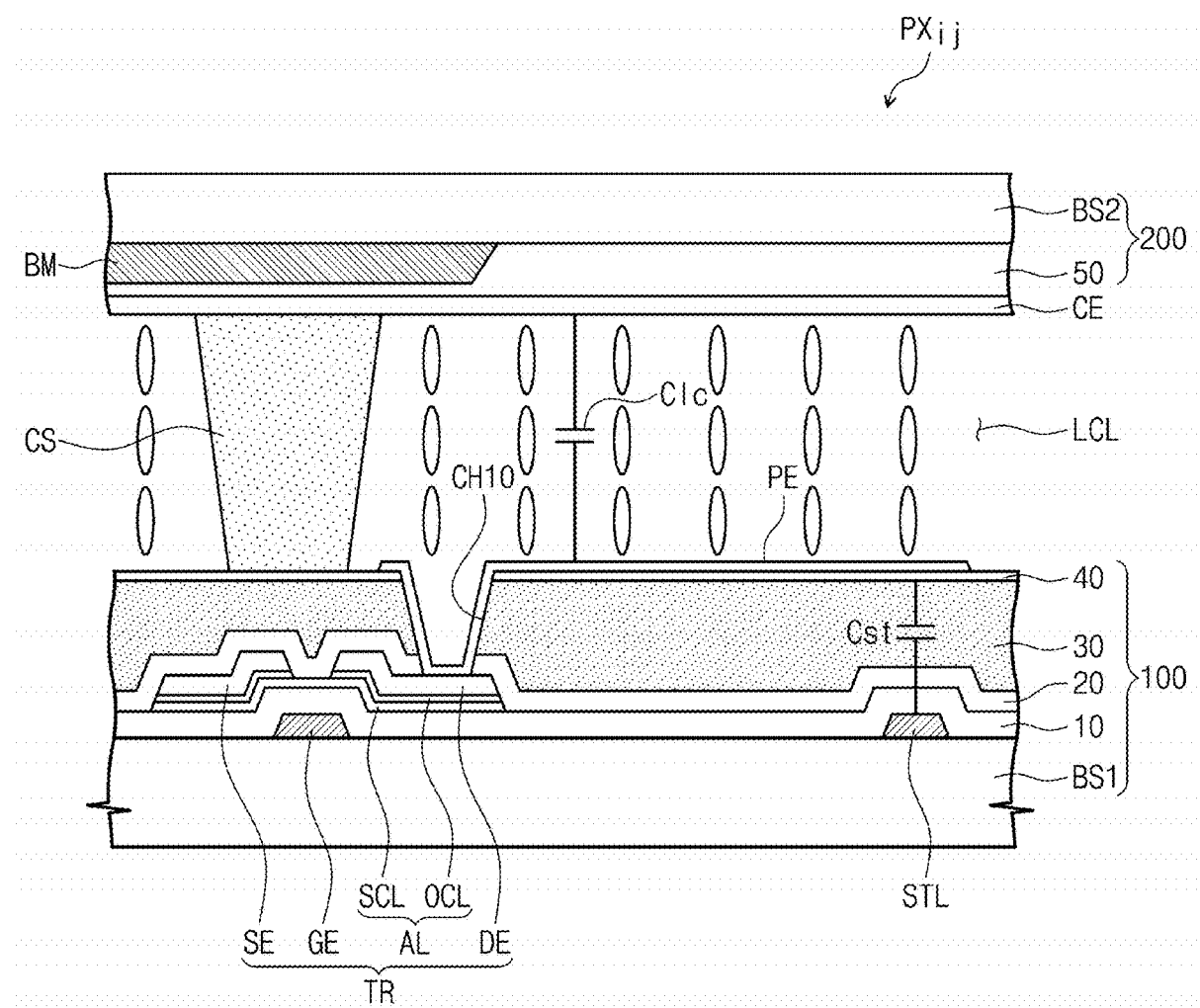
FIGS. 6A to 6C are schematic cross-sectional views of display areas of display panels constructed according to some embodiments of the invention.
Figure 6B:
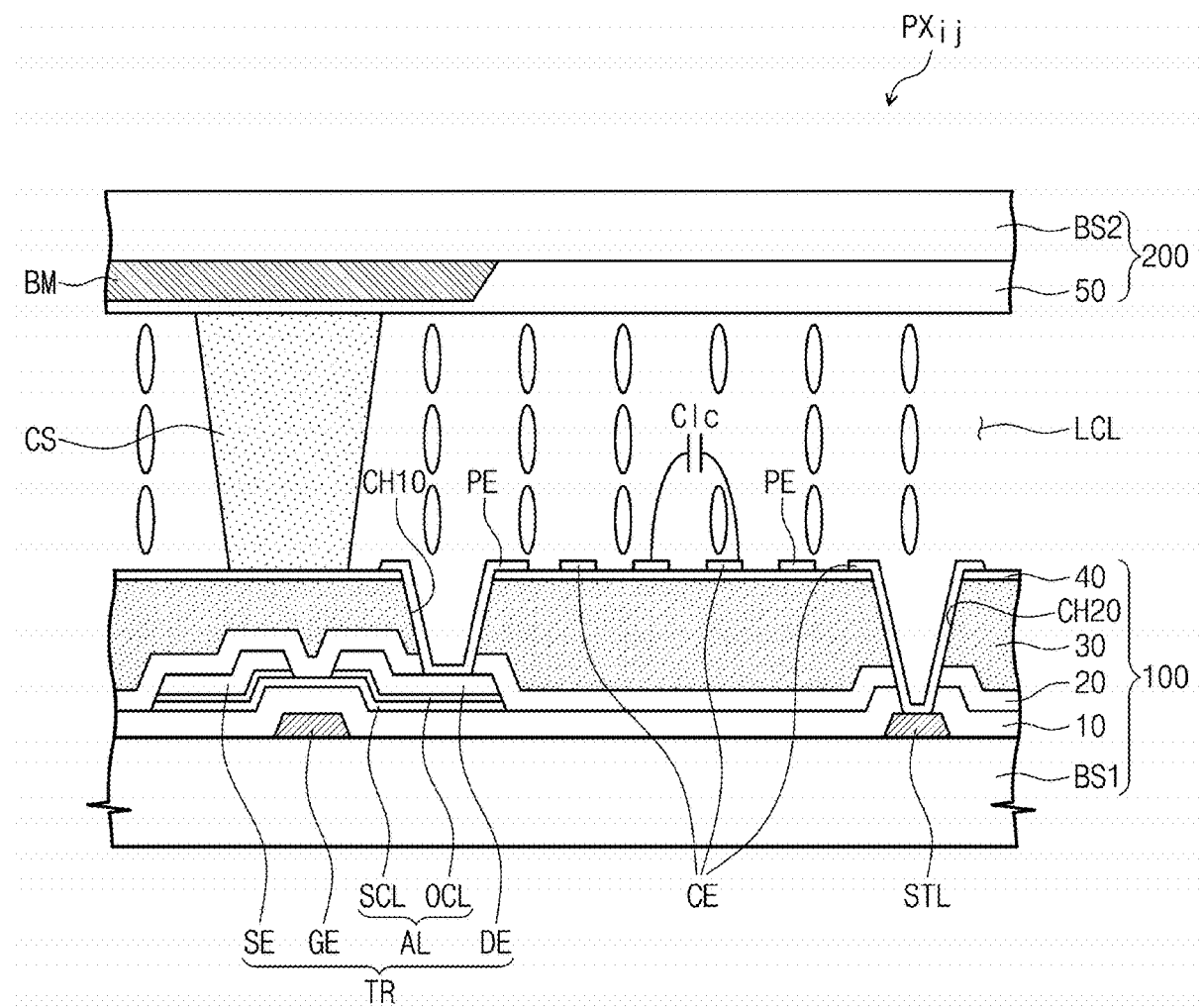
Figure 6C:
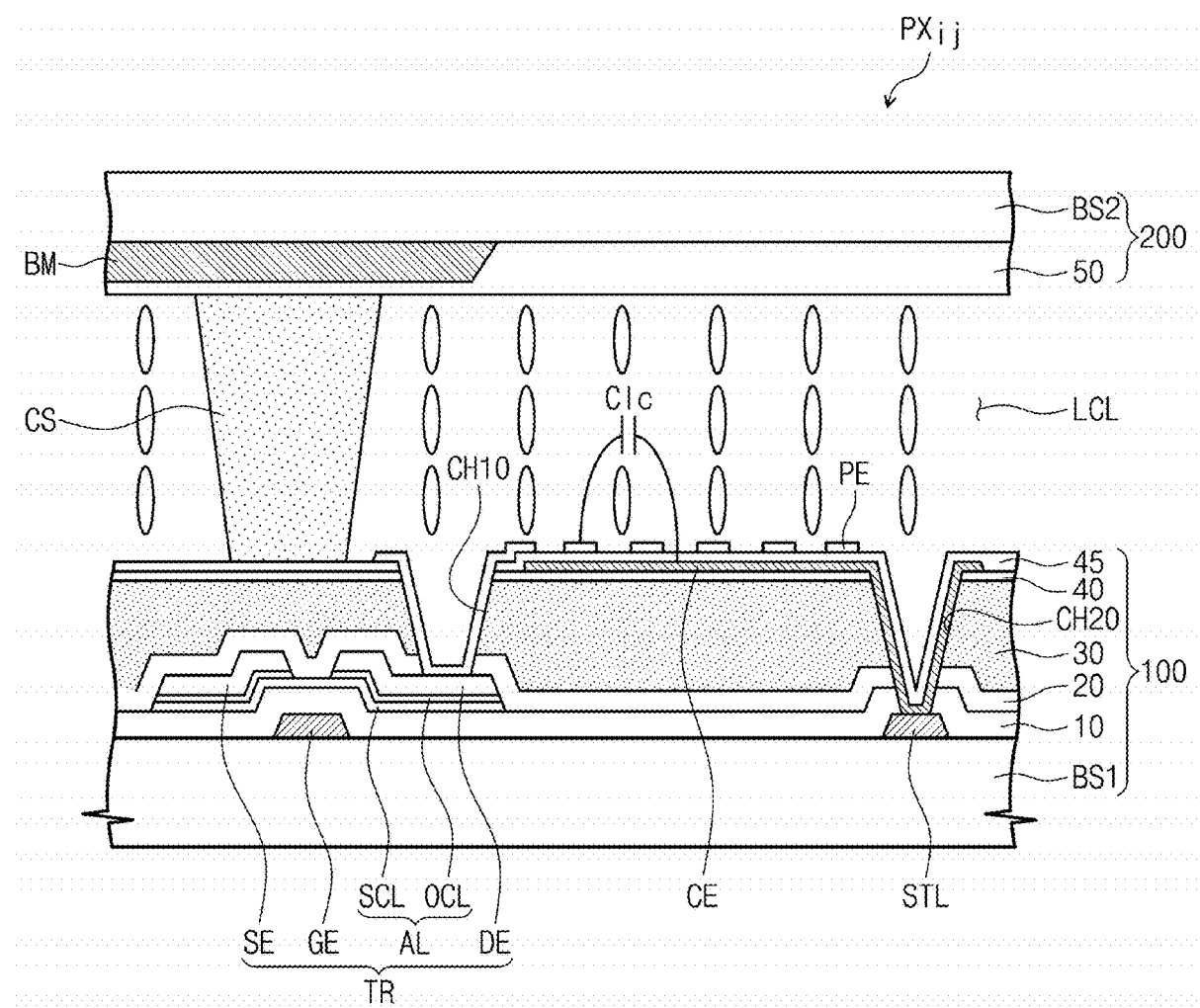
Figure 8:
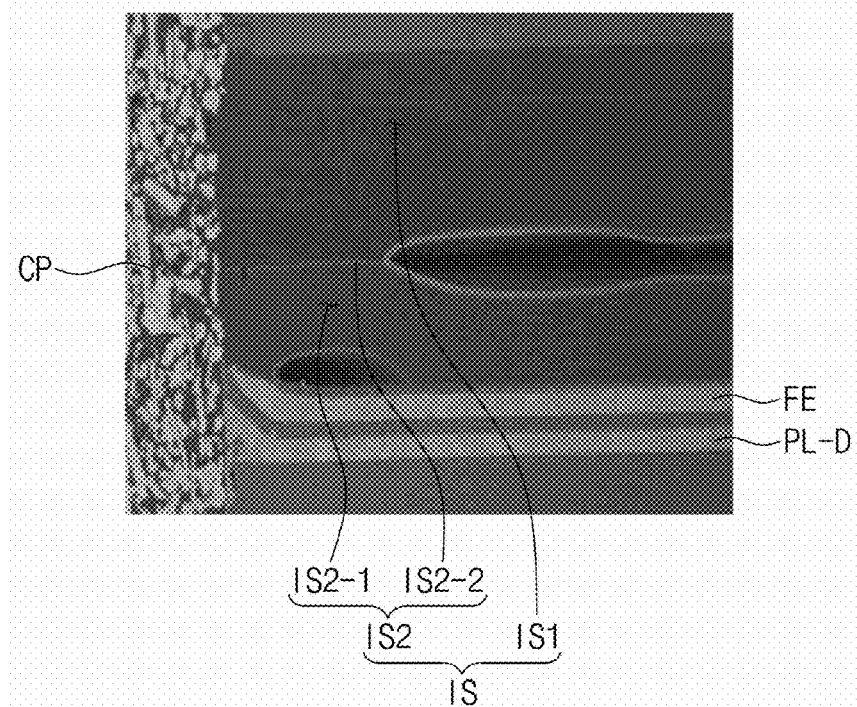
FIG. 8 is a cross-sectional image of a non-display area of a display panel constructed according to an embodiment of the invention.

FIG. 5 is an equivalent circuit diagram of a pixel of a display panel of the display device of FIG. 2. FIGS. 6A to 6C are schematic cross-sectional views of display areas of display panels constructed according to some embodiments of the invention. FIG. 7 is a schematic cross-sectional view of a non-display area of a display panel constructed according to an embodiment of the invention. FIG. 8 is a cross-sectional image of a non-display area of a display panel constructed according to an embodiment of the invention.

FIGS. 5 to 8 illustrate liquid crystal display panels as an example of display panel DP. Pixel PXij connected to the i$^{th}$ gate line GLi and the j$^{th}$ data line DLj is illustrated as an example in FIG. 5.

Pixel PXij may include thin film transistor TR (hereinafter, referred to as 'transistor'), liquid crystal capacitor Clc, and storage capacitor Cst. Liquid crystal capacitor Clc may correspond to a display element, and transistor TR and storage capacitor Cst may constitute a pixel driving circuit. The numbers of transistor TR and storage capacitor Cst may be changed depending on an operating mode of the liquid crystal display panel.

Liquid crystal capacitor Clc may store a pixel voltage outputted from transistor TR. Arrangement of liquid crystal directors included in liquid crystal layer LCL may be changed depending on the amount of charge stored in liquid crystal capacitor Clc. In other words, the liquid crystal directors may be controlled by an electric field formed between two electrodes of liquid crystal capacitor Clc. Light incident to liquid crystal layer LCL may be transmitted or blocked according to the arrangement of the liquid crystal directors.

Storage capacitor Cst is connected in parallel to liquid crystal capacitor Clc. Storage capacitor Cst maintains the arrangement of the liquid crystal directors for a certain period.

Transistor TR includes control electrode GE connected to the i$^{th}$ gate line GLi, active part AL overlapping control electrode GE, input electrode SE connected to the j$^{th}$ data line DLi, and output electrode DE spaced apart from input electrode SE.

Liquid crystal capacitor Clc includes pixel electrode PE and common electrode CE. Storage capacitor Cst includes pixel electrode PE and a portion of storage line STL overlapping pixel electrode PE.

The i$^{th}$ gate line GLi and storage line STL are disposed on one surface of first base substrate BS1 of first display substrate 100. Control electrode GE is branched from the i$^{th}$ gate line GLi. The i$^{th}$ gate line GLi and storage line STL may include a metal (e.g., aluminum (Al), silver (Ag), copper (Cu), molybdenum (Mo), chromium (Cr), tantalum (Ta), or titanium (Ti)) or any alloy thereof. In an embodiment, the i$^{th}$ gate line GLi and storage line STL may have a multi-layered structure (e.g., a titanium layer and a copper layer).

First base substrate BS1 may be a glass substrate or a plastic substrate. First insulating layer 10 may be disposed on one surface of first base substrate BS1 and may cover control electrode GE and storage line STL. First insulating layer 10 may include at least one of an inorganic material and an organic material. For example, first insulating layer 10 may include a silicon nitride layer, a silicon oxynitride layer, a silicon oxide layer, a titanium oxide layer, and an aluminum oxide layer. In an embodiment, first insulating layer 10 may include a multi-layered structure (e.g., a silicon nitride layer and a silicon oxide layer).

Active part AL overlapping control electrode GE is disposed on first insulating layer 10. Active part AL may include semiconductor layer SCL and ohmic contact layer OCL. Semiconductor layer SCL is disposed on first insulating layer 10, and ohmic contact layer OCL is disposed on semiconductor layer SCL.

Semiconductor layer SCL may include amorphous silicon or poly-silicon. Alternatively, semiconductor layer SCL may include a metal oxide semiconductor. Ohmic contact layer OCL may be doped with dopants. A concentration of the dopants in ohmic contact layer OCL may be higher than a concentration of dopants in semiconductor layer SCL.

Ohmic contact layer OCL may include two portions spaced apart from each other. In an embodiment of the invention, ohmic contact layer OCL may have a unitary body.

Output electrode DE and input electrode SE are disposed on active part AL. Output electrode DE and input electrode SE are spaced apart from each other. Each of output electrode DE and input electrode SE partially overlaps control electrode GE.

Second insulating layer 20 is disposed on first insulating layer 10 and covers active part AL, output electrode DE, and input electrode SE. Second insulating layer 20 may include at least one of an inorganic material and an organic material. For example, second insulating layer 20 may include a silicon nitride layer, a silicon oxynitride layer, a silicon oxide layer, a titanium oxide layer, and an aluminum oxide layer. In an embodiment, second insulating layer 20 may include a multi-layered structure (e.g., a silicon nitride layer and a silicon oxide layer).

Transistor TR having a staggered structure is illustrated as an example in FIG. 6A. However, the structure of transistor TR is not limited thereto. In another embodiment, transistor TR may have a planar structure.

Third insulating layer 30 is disposed on second insulating layer 20. Third insulating layer 30 may be a single organic layer providing a flat surface. In the illustrated embodiment, third insulating layer 30 may include a plurality of color filters. The color filter may completely cover at least pixel area PXA as illustrated in FIG. 3. The color filters of adjacent pixels may partially overlap each other in peripheral area NPXA.

Fourth insulating layer 40 is disposed on third insulating layer 30. Fourth insulating layer 40 may be an inorganic layer covering the color filters. For example, fourth insulating layer 40 may include a silicon nitride layer, a silicon oxynitride layer, a silicon oxide layer, a titanium oxide layer, and an aluminum oxide layer. In an embodiment, fourth insulating layer 40 may include a multi-layered structure (e.g., a silicon nitride layer and a silicon oxide layer).

Pixel electrode PE is disposed on fourth insulating layer 40. Pixel electrode PE is connected to output electrode DE through contact hole CH10 penetrating second, third and fourth insulating layers 20, 30 and 40. An alignment layer covering pixel electrode PE may be disposed on fourth insulating layer 40.

Second base substrate BS2 of second display substrate 200 may be a glass substrate or a plastic substrate. Black matrix layer BM is disposed on a bottom surface of second base substrate BS2. Black matrix layer BM may have a shape corresponding to peripheral area NPXA as illustrated in FIG. 3. In other words, openings corresponding to pixel areas PXA may be defined in black matrix layer BM.

At least one insulating layer covering black matrix layer BM are disposed on the bottom surface of second base substrate BS2. Fifth insulating layer 50 providing a substantially flat surface is illustrated as an example of the insulating layer disposed on the bottom surface of second base substrate BS2 in FIG. 6A. Fifth insulating layer 50 may include an organic material.

Common electrode CE is disposed on the bottom surface of second base substrate BS2. A common voltage is applied to common electrode CE. A value of the common voltage is different from that of the pixel voltage. However, the cross-section of pixel PXij of FIG. 6A is illustrated as an example of the invention. In another embodiment, first display substrate 100 and the second display substrate 200 may be turned over.

In the illustrated embodiment, the liquid crystal display panel of a vertical alignment (VA) mode is described as an example. However, the inventive concepts are not limited thereto. Embodiments of the invention may be applied to a liquid crystal display panel of an in-plane switching (IPS) mode, a fringe-field switching (FFS) mode, a plane-to-line switching (PLS) mode, a super vertical alignment (SVA) mode, or a surface-stabilized vertical alignment (SS-VA) mode or other modes known in the art.

The liquid crystal display panel of the in-plane switching (IPS) mode is illustrated in FIG. 6B, and the liquid crystal display panel of the plane-to-line switching (PLS) mode is illustrated in FIG. 6C. In the liquid crystal display panel of the in-plane switching (IPS) mode, pixel electrode PE and common electrode CE may be disposed on substantially the same layer. Each of pixel electrode PE and common electrode CE may include a plurality of branch portions. The branch portions of pixel electrode PE and the branch portions of common electrode CE may be alternately arranged. Common electrode CE may be connected to a signal line (e.g., storage line STL) receiving the common voltage through contact hole CH20.

In the liquid crystal display panel of the plane-to-line switching (PLS) mode, pixel electrode PE and common electrode CE may be disposed on fourth insulating layer 40 with sixth insulating layer 45 interposed therebetween. Pixel electrode PE may include a plurality of branch portions or may include a plurality of slits.

Spacer CS may be disposed between first display substrate 100 and second display substrate 200. Spacer CS maintains gap GP as illustrated in FIG. 3. Spacer CS may include a photosensitive organic material. Spacer CS overlaps peripheral area NPXA. Spacer CS may overlap transistor TR.

As illustrated in FIG. 7, side surface PL-DS of auxiliary signal line PL-D is substantially aligned with side surface BS1-S of first base substrate BS1. Side surface of insulating structure IS is substantially aligned with side surface BS1-S of first base substrate BS1. Insulating structure IS includes first insulating structure IS1 that is in contact with insulating layer 50 of second display substrate 200. First insulating structure IS1 is disposed between insulating layer 50 and first base substrate BS1. In a case that an alignment layer is disposed under insulating layer 50, first insulating structure IS1 may be in contact with the alignment layer. The alignment layer may be defined as another insulating layer.

Figure 9A:
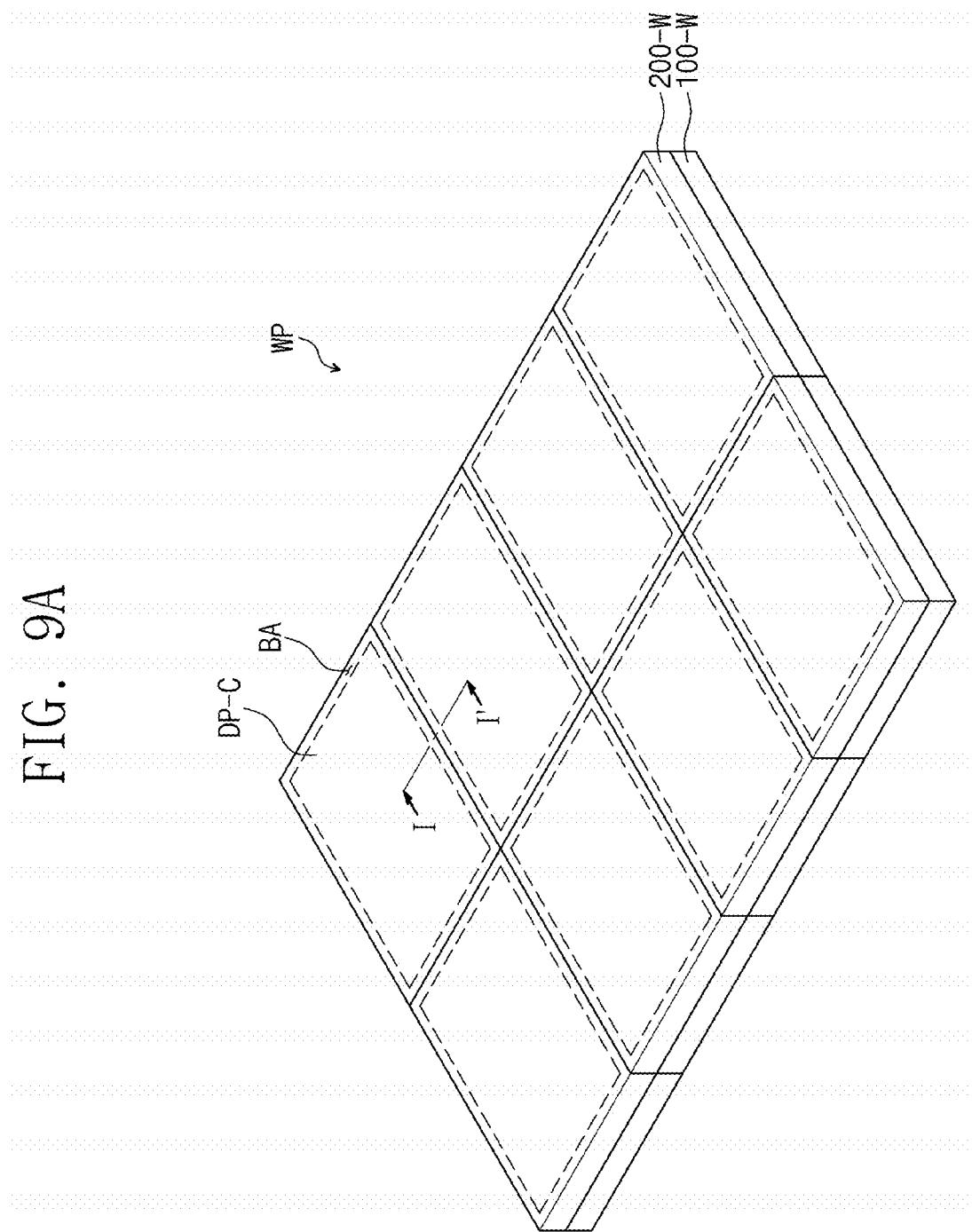
FIG. 9A is a schematic perspective view of a work panel used in an exemplary method of manufacturing a display panel according to an embodiment of the invention.
Figure 9B:
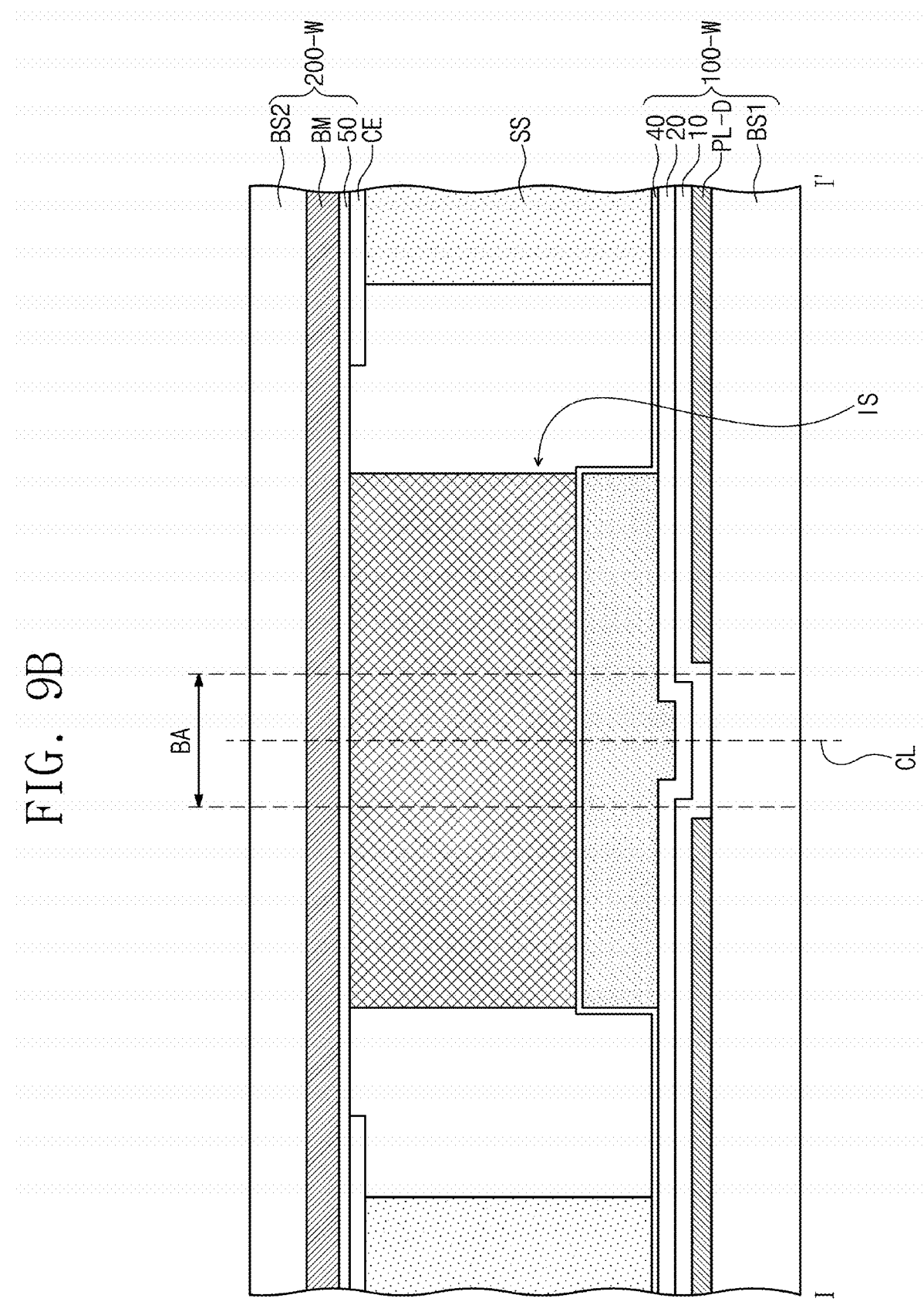
FIG. 9B is a schematic cross-sectional view of the work panel of FIG. 9A.

First insulating structure IS1 may include substantially the same material as spacer CS illustrated in FIGS. 6A to 6C. When second work substrate 200-W to be describe later with FIGS. 9A to 9C is manufactured, first insulating structure IS1 and spacer CS may be formed by substantially the same process.

Insulating structure IS includes second insulating structure IS2 that corresponds to a portion of first display substrate 100. A side surface of second insulating structure IS2 is substantially aligned with side surface BS1-S of first base substrate BS1. Second insulating structure IS2 may have a two-layer structure. First layer IS2-1 of second insulating structure IS2 may include an organic material. First layer IS2-1 may include substantially the same material as third insulating layer 30 as illustrated in FIG. 6A to 6C. First layer IS2-1 may include substantially the same material as the color filter. Second layer IS2-2 of second insulating structure IS2 may include an inorganic material. Second layer IS2-2 may be a portion of fourth insulating layer 40. In an embodiment of the invention, second layer IS2-2 may be omitted.

Connection pad CP is disposed on the side surface of display panel DP. Connection pad CP may be provided in plurality, and connection pads CP may be in contact with side surfaces PL-DS of auxiliary signal lines PL-D, respectively. Connection pad CP may be in contact with side surface BS1-S of first base substrate BS1, side surface PL-DS of auxiliary signal line PL-D, and the side surface of insulating structure IS. In one embodiment of the invention, connection pad CP may be in contact with side surface BS1-S of first base substrate BS1, the side surface of insulating structure IS and the side surface of second base substrate BS2. Connection pad CP being in contact with side surface IS2-S of second insulating structure IS2 is illustrated as an example in FIG. 7. Connection pad CP may include metal paste. The metal paste includes a mixture of a metal and an insulating material. Connection pad CP may include silver paste.

Connection pad CP may be electrically connected to pad DCB-P of circuit substrate DCB through an anisotropic conductive film (ACF). The size of the pads DCB-P of circuit board DCB and the size of the anisotropic conductive film (ACF) may be set to correspond to the size of connection pad CP. The anisotropic conductive film (ACF) may be replaced with solder paste, and connection pad CP may be connected directly to pad DCB-P of circuit substrate DCB.

Sealing structure SS may be disposed inside insulating structure IS and may be disposed between common electrode CE and fourth insulating layer 40. In the event that the alignment layers are disposed, sealing structure SS is disposed between the alignment layers. Black matrix layer BM is also disposed in non-display area NDA.

FIG. 8 shows auxiliary signal line PL-D overlapping with insulating structure IS and connection pad CP connected to auxiliary signal line PL-D. Insulating structure IS may be disposed to remove a gap between first and second display substrates 100 and 200 near the side surface of display panel DP. Thus, it is possible to prevent an end portion of auxiliary signal line PL-D from being damaged in manufacturing processes to be described later.

Figure 9D:
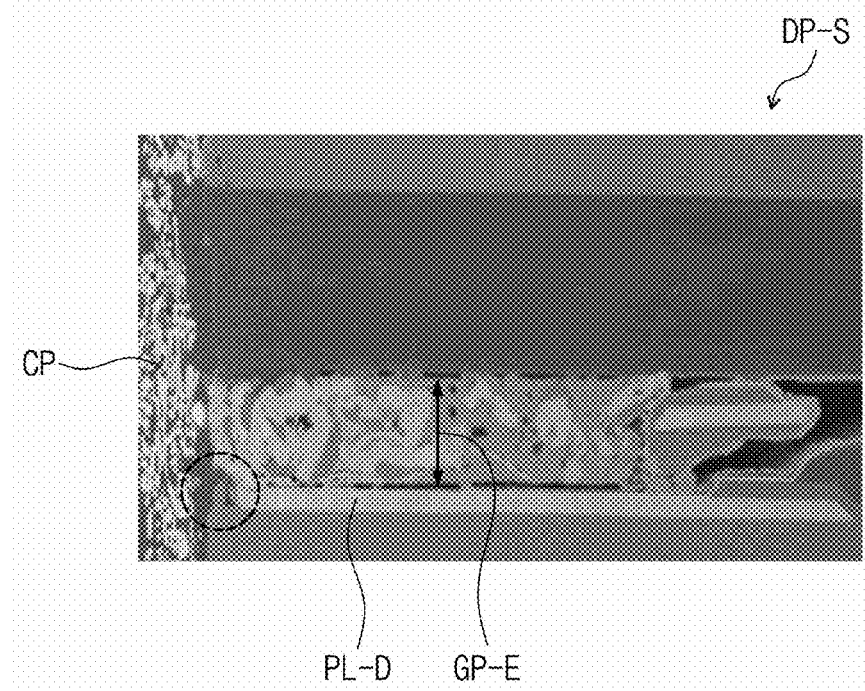
FIG. 9D is a cross-sectional image of a display panel as a comparative example.

FIG. 9A is a schematic perspective view of a work panel used in an exemplary method of manufacturing a display panel according to an embodiment of the invention. FIG. 9B is a schematic cross-sectional view of the work panel of FIG. 9A. FIG. 9C is a schematic cross-sectional view of a preliminary display panel cut from the work panel of FIG. 9A. FIG. 9D is a cross-sectional image of a display panel as a comparative example.

As illustrated in FIG. 9A, substantially the same process may be performed on cell areas DP-C defined in work panel WP to form display panel DP as illustrated in FIGS. 5 to 7 in each of cell areas DP-C. In more detail, first work substrate 100-W and second work substrate 200-W may be coupled to each other to form work panel WP. First work substrate 100-W may have substantially the same structure as first display substrate 100 described with reference to FIGS. 5 to 7 in each of cell areas DP-C, and second work substrate 200-W may have substantially the same structure as second display substrate 200 described with reference to FIGS. 5 to 7 in each of cell areas DP-C.

As illustrated in FIG. 9B, a structure extending from structures of cell areas DP-C may be disposed in boundary area BA of work panel WP. Work panel WP may be cut along cutting line CL illustrated in FIG. 9B by, for example, a scribing process, and thus preliminary display panel DP-P of FIG. 9C may be separated.

A side surface of preliminary display panel DP-P of FIG. 9C is in a non-uniform state, as compared with the side surface of display panel DP of FIG. 7. The side surface of preliminary display panel DP-P is ground using grinder GM, which is known as a grinding process. A side surface of insulating structure IS, a side surface of auxiliary signal line PL-D, a side surface of first base substrate BS1 and a side surface of second base substrate BS2 may be substantially aligned with one another using the grinding process. A cross-sectional shape of auxiliary signal line PL-D may be different depending on the grinding method (e.g., a rotational direction of grinder GM). However, the side surface of auxiliary signal line PL-D and the side surface of first base substrate BS1 may be substantially aligned with each other regardless of the grinding method. The side surface of auxiliary signal line PL-D of FIG. 8 is formed according to the rotational direction of grinder GM of FIG. 9C.

As used herein, the term "substantially aligned" may include a case in which the side surfaces of insulating structure IS, auxiliary signal line PL-D and first and second base substrates BS1 and BS2 constitute one surface, and the term "substantial alignment" may also include variations as a result of manufacturing techniques and/or process tolerances. For example, the side surface of auxiliary signal line PL-D may have a fine curved surface formed by grinder GM. A corner defining a curved side surface of auxiliary signal line PL-D may be aligned with a corner defining the side surface of insulating structure IS.

Damage/deformation of the end portion of auxiliary signal line PL-D may be prevented in the grinding process. This may be because insulating structure IS supports first display substrate 100 and second display substrate 200 to prevent the side surface of display panel DP from being damaged/deformed by friction of grinder GM.

FIG. 9D shows a cross-section of display panel DP-S as a comparative example. FIG. 9D shows a cross-section corresponding to that of FIG. 8. However, since insulating structure IS is not disposed in region GP-E corresponding to insulating structure IS in FIG. 9D, region GP-E is filled with sludge generated in the grinding process. In addition, the sludge of first base substrate BS1 covers a side surface of auxiliary signal line PL-D, and thus auxiliary signal line PL-D is not completely connected to connection pad CP. In other words, a contact resistance between auxiliary signal line PL-D and connection pad CP is increased.

Figure 10:
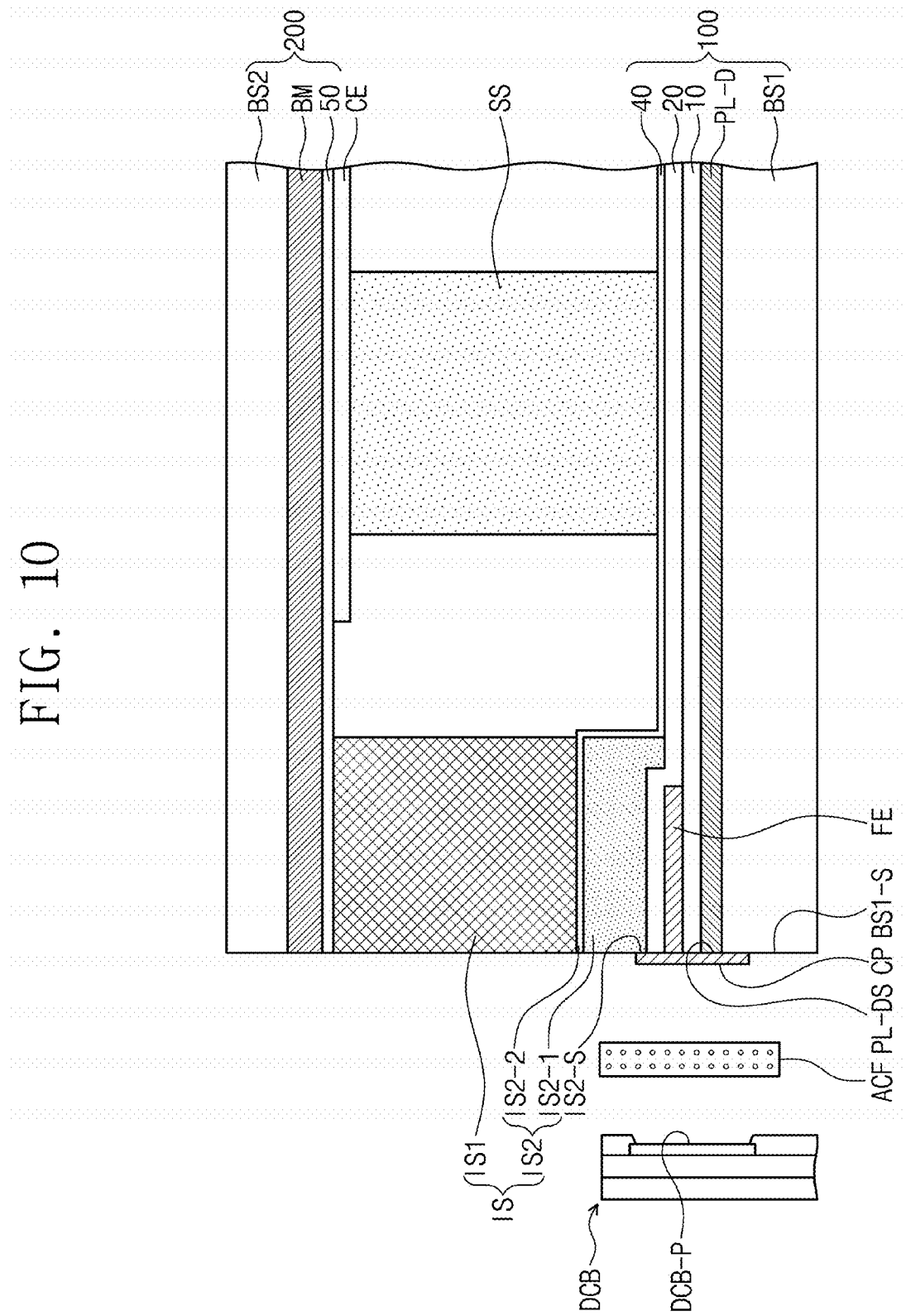
FIG. 10 is a schematic cross-sectional view of a non-display area of a display panel constructed according to an embodiment of the invention.

FIG. 10 is a schematic cross-sectional view of a non-display area of a display panel constructed according to an embodiment of the invention. FIG. 10 illustrates a cross-sectional view corresponding to FIG. 7. Hereinafter, the descriptions to the same or substantially the same components as in the embodiments of FIGS. 1 to 9D will be omitted to avoid redundancy.

Display panel DP according to the illustrated embodiment further includes floating electrode FE, as compared with display panel DP described with reference to FIGS. 1 to 8. Floating electrode FE overlaps auxiliary signal line PL-D and first layer IS2-1 of second insulating structure IS2. Floating electrode FE is disposed between auxiliary signal line PL-D and first layer IS2-1 of second insulating structure IS2. Floating electrode FE may be disposed on substantially the same layer as input electrode SE of the transistor.

A side surface of floating electrode FE may be substantially aligned with the side surface of first base substrate BS1. Connection pad CP may be in contact with the side surface of floating electrode FE.

Floating electrode FE is shown in FIG. 8. Floating electrode FE may be disposed on auxiliary signal line PL-D to withstand stress applied to auxiliary signal line PL-D in the grinding process, and thus damage/deformation of auxiliary signal line PL-D may be prevented.

Figure 11:
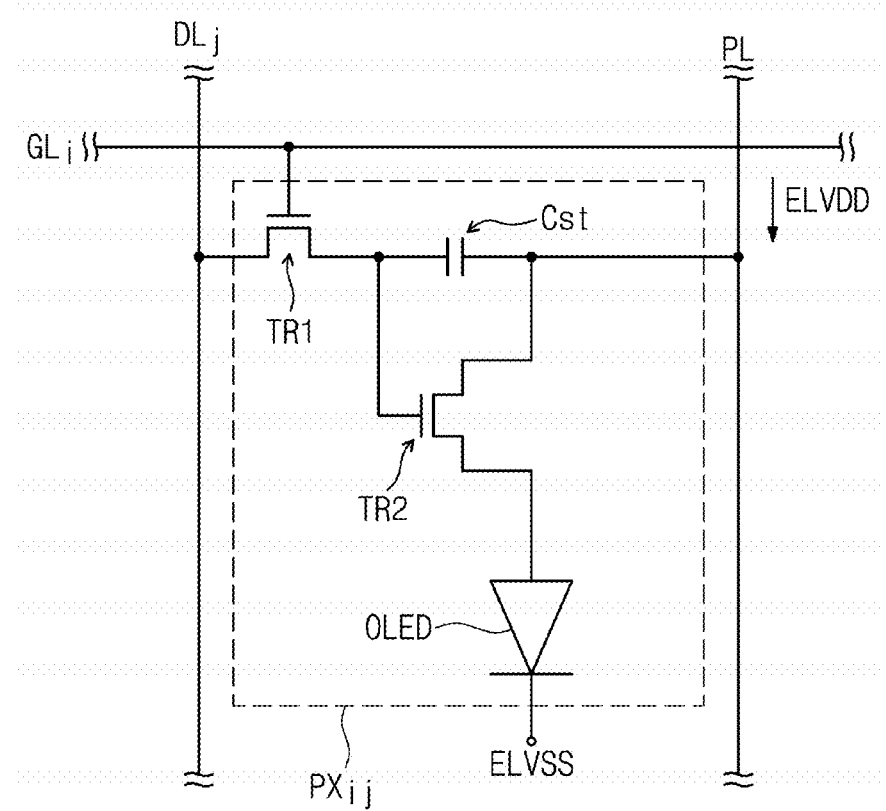
FIG. 11 is an equivalent circuit diagram of a pixel that may be employed in any of the display panels constructed according to an embodiment of the invention.
Figure 12:
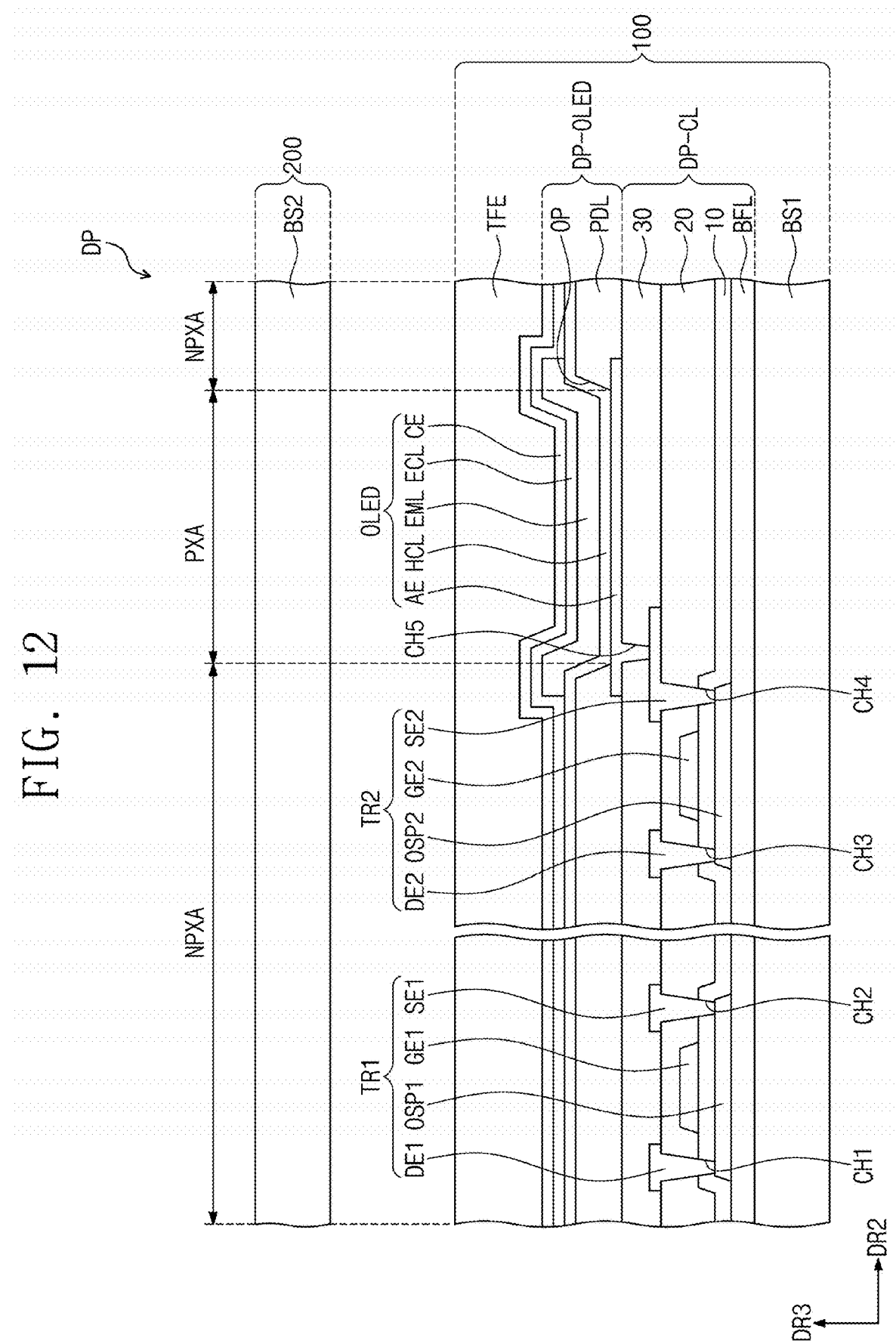
FIG. 12 is a schematic cross-sectional view of a display area of a display panel constructed according to an embodiment of the invention.
Figure 13:
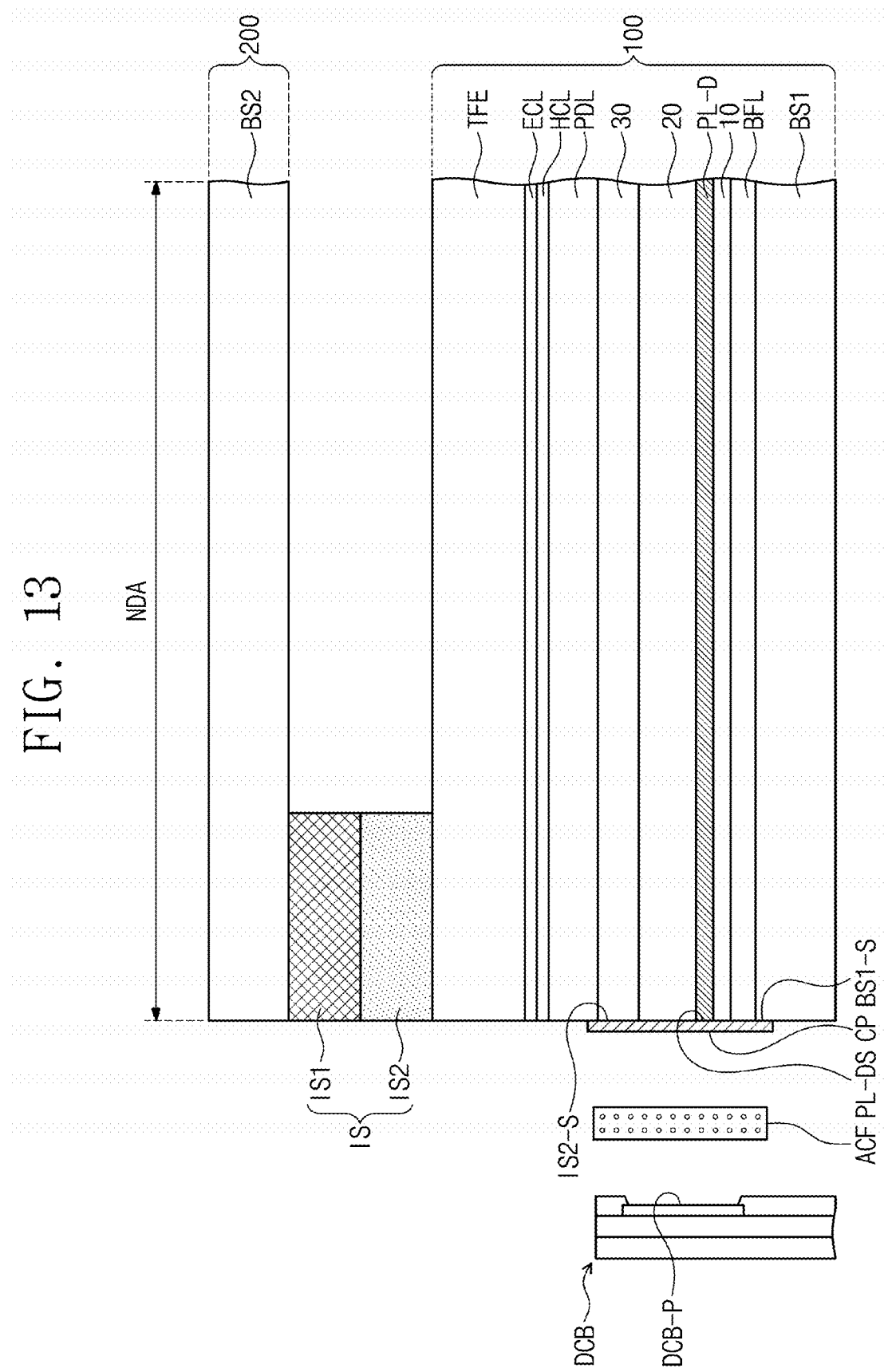
FIG. 13 is a schematic cross-sectional view of a non-display area of a display panel constructed according to an embodiment of the invention.

FIG. 11 is an equivalent circuit diagram of a pixel that may be employed in any of the display panels constructed according to an embodiment of the invention. FIG. 12 is a schematic cross-sectional view of a display area of a display panel constructed according to an embodiment of the invention. FIG. 13 is a schematic cross-sectional view of a non-display area of a display panel constructed according to an embodiment of the invention.

The liquid crystal display panels were described as examples with reference to FIGS. 5 to 8. However, the principles of the invention may also be applied to other types of display, such as an organic light emitting display panel as illustrated in FIGS. 11 to 13. Hereinafter, differences between the liquid crystal display panel and the organic light emitting display panel will be mainly described to avoid redundancy.

As illustrated in FIG. 11, pixel PXij may include an organic light emitting diode OLED and a pixel driving circuit. The organic light emitting diode OLED may be a front surface type light emitting diode or a back surface type light emitting diode. The pixel driving circuit may include first thin film transistor (or a switching transistor) TR1, second thin film transistor (or a driving transistor) TR2, and capacitor Cst. First power source voltage ELVDD is provided to second thin film transistor TR2, and second power source voltage ELVSS is provided to the organic light emitting diode OLED. Second power source voltage ELVSS may be lower than first power source voltage ELVDD. However, the pixel driving circuit may not be limited thereto but may be variously modified. The pixel driving circuit may further include a plurality of transistors and/or may include two or more capacitors. In another embodiment, the organic light emitting diode OLED may be connected between power line PL and second thin film transistor TR2.

As illustrated in FIG. 12, circuit element layer DP-CL, display element layer DP-OLED and thin film encapsulation layer TFE are sequentially stacked on first base substrate BS1. In the illustrated embodiment, circuit element layer DP-CL may include buffer layer BFL corresponding to an inorganic layer, first insulating layer 10, second insulating layer 20, and third insulating layer 30. First insulating layer 10 and second insulating layer 20 may be inorganic layers, and third insulating layer 30 may be an organic layer. Materials of the inorganic layers and the organic layer are not limited to specific materials, and buffer layer BFL may be disposed or omitted in some embodiments of the invention.

Semiconductor pattern OSP1 (hereinafter, referred to as 'first semiconductor pattern') of first thin film transistor TR1 and semiconductor pattern OSP2 (hereinafter, referred to as 'second semiconductor pattern') of second thin film transistor TR2 are disposed on buffer layer BFL. Each of first and second semiconductor patterns OSP1 and OSP2 may be at least one material selected from the group consisting of amorphous silicon, poly-silicon, and a metal oxide semiconductor.

First insulating layer 10 is disposed on first semiconductor pattern OSP1 and second semiconductor pattern OSP2. Control electrode GE1 (hereinafter, referred to as 'first control electrode') of first thin film transistor TR1 and control electrode GE2 (hereinafter, referred to as 'second control electrode') of second thin film transistor TR2 are disposed on first insulating layer 10. First control electrode GE1 and second control electrode GE2 may be formed using substantially the same photolithography process as scan lines GLi formed with reference to FIG. 11.

Second insulating layer 20 is disposed on first insulating layer 10 and covers first control electrode GE1 and second control electrode GE2. Input electrode DE1 (hereinafter, first input electrode) and output electrode SE1 (hereinafter, first output electrode) of first thin film transistor TR1 and input electrode DE2 (hereinafter, second input electrode) and output electrode SE2 (hereinafter, second output electrode) of second thin film transistor TR2 are disposed on second insulating layer 20.

First input electrode DE1 and first output electrode SE1 are connected to portions of first semiconductor pattern OSP1 via first through-hole CH1 and second through-hole CH2 penetrating first and second insulating layers 10 and 20, respectively. Second input electrode DE2 and second output electrode SE2 are connected to portions of second semiconductor pattern OSP2 via third through-hole CH3 and fourth through-hole CH4 penetrating first and second insulating layers 10 and 20, respectively. Meanwhile, in other embodiments, at least one of first thin film transistor TR1 or second thin film transistor TR2 may have a bottom gate structure.

Third insulating layer 30 is disposed on second insulating layer 20 and covers first input electrode DE1, second input electrode DE2, first output electrode SE1, and second output electrode SE2. Third insulating layer 30 may provide a flat surface.

Display element layer DP-OLED is disposed on third insulating layer 30. Display element layer DP-OLED may include pixel defining layer PDL and the organic light emitting diode OLED. Pixel defining layer PDL may include an organic material. First electrode AE is disposed on third insulating layer 30. First electrode AE is connected to second output electrode SE2 via fifth through-hole CH5 penetrating third insulating layer 30. Opening OP is defined in pixel defining layer PDL. Opening OP of pixel defining layer PDL exposes at least a portion of first electrode AE. In an embodiment of the invention, pixel defining layer PDL may be omitted.

Display area DA may include pixel area (or a light emitting area) PXA and peripheral area (or a non-light emitting area) NPXA adjacent to pixel area PXA. Peripheral area NPXA may surround pixel area PXA. In the illustrated embodiment, pixel area PXA is defined to correspond to a partial area of first electrode AE, which is exposed through opening OP.

In an embodiment of the invention, pixel area PXA may also overlap at least one of first thin film transistor TR1 and second thin film transistor TR2. Opening OP may be more widened, and first electrode AE and light emitting layer EML to be described later may also be more widened.

Hole control layer HCL may be disposed in common in pixel area PXA and peripheral area NPXA. Even though not shown in the drawings, a common layer such as hole control layer HCL may be formed in common in pixel areas PXA as illustrated in FIG. 3.

Light emitting layer EML is disposed on hole control layer HCL. Light emitting layer EML may be disposed in an area corresponding to opening OP. In other words, light emitting layers EML of pixel areas PXA may be separated from each other. Light emitting layer EML may include an organic material and/or an inorganic material. Light emitting layer EML may generate light having a predetermined color.

In the illustrated embodiment, the patterned light emitting layer EML is illustrated as an example. However, in another embodiment, light emitting layer EML may be disposed in common in pixel areas PXA as illustrated in FIG. 3. In this case, light emitting layer EML may generate white light. In addition, light emitting layer EML may have a multi-layered structure called 'a tandem'.

Electron control layer ECL is disposed on light emitting layer EML. Even though not shown in the drawings, electron control layer ECL may be formed in common in pixel areas PXA as illustrated in FIG. 3. Second electrode CE is disposed on electron control layer ECL. Second electrode CE is disposed in common in pixel areas PXA as illustrated in FIG. 3.

Thin film encapsulation layer TFE is disposed on second electrode CE. Thin film encapsulation layer TFE is disposed in common in pixel areas PXA as illustrated in FIG. 3. In the illustrated embodiment, thin film encapsulation layer TFE directly covers second electrode CE. In an embodiment of the invention, a capping layer covering second electrode CE may further be disposed between thin film encapsulation layer TFE and second electrode CE. In this case, thin film encapsulation layer TFE may directly cover the capping layer.

In an embodiment of the invention, the organic light emitting diode OLED may further include a resonance structure for controlling a resonance distance of light generated from light emitting layer EML. The resonance structure may be disposed between first electrode AE and second electrode CE, and a thickness of the resonance structure may be determined depending on a wavelength of the light generated from light emitting layer EML.

Second base substrate BS2 is spaced apart from thin film encapsulation layer TFE. Second base substrate BS2 may include a glass substrate or a plastic substrate. Second base substrate BS2 corresponds to second display substrate 200 in the illustrated embodiment. However, in another embodiment, various functional layers may be disposed on a top surface or a bottom surface of second base substrate BS2.

As illustrated in FIG. 13, thin film encapsulation layer TFE, electron control layer ECL and hole control layer HCL extend into non-display area NDA. Insulating structure IS is disposed between second base substrate BS2 and first base substrate BS1. A side surface of insulating structure IS is substantially aligned with a side surface of first base substrate BS1. Insulating structure IS having a two-layer structure is illustrated as an example in the illustrated embodiment. However, the inventive concepts are not limited thereto.

First insulating structure IS1 and second insulating structure IS2 of insulating structure IS may be substantially the same as first insulating structure IS1 and second insulating structure IS2 described with reference to FIG. 7. However, the inventive concepts are not limited thereto. In other embodiments, each of first and second insulating structures IS1 and IS2 may include an organic layer and may be variously modified.

Insulating structure IS is disposed between the topmost surface of first display substrate 100 and the bottommost surface of second display substrate 200. In the illustrated embodiment, the topmost surface of first display substrate 100 corresponds to a top surface of thin film encapsulation layer TFE, and the bottommost surface of second display substrate 200 corresponds to a bottom surface of second base substrate BS2. However, the inventive concepts are not limited thereto. In another embodiment, thin film encapsulation layer TFE, electron control layer ECL and hole control layer HCL may not be disposed in non-display area NDA, and a top surface of pixel defining layer PDL may correspond to the topmost surface of first display substrate 100.

According to the above descriptions, a connection pad may be disposed on a side surface of a display panel, and thus a circuit substrate may be connected to the side surface of the display panel. Since a connection area of the circuit substrate and the display panel is defined on the side surface of the display panel, the non-display area may be reduced and the structural integrity may be increased.

Since a side surface of an insulating structure is substantially aligned with the side surface of the display panel and a side surface of a signal line, it is possible to prevent the signal line from being damaged and/or deformed in a manufacturing process such as a grinding process. A contact area defined on the side surface of the signal line may be secured, thereby reducing a contact resistance between the circuit substrate and the display panel.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display panel comprising:
   a first substrate having a top surface and a side surface, the top surface including a display area and a non-display area outside the display area;
   a second substrate facing the first substrate;
   a first insulating structure disposed between the second substrate and the first substrate, wherein the first insulating structure overlaps the non-display area without overlapping the display area;
   a pixel disposed between the first substrate and the second substrate and overlapping the display area;
   a signal line having a side surface substantially aligned with the side surface of the first substrate, wherein the signal line is disposed on the first substrate;
   a second insulating structure overlapping the signal line and disposed between the first substrate and the first insulating structure, wherein the second insulating structure has a side surface substantially aligned with the side surface of the first substrate; and
   a connection pad being in contact with the side surface of the signal line,
   wherein the second insulating structure includes an organic layer overlapping the signal line and the non-display area without overlapping the display area, and an inorganic layer disposed on the organic layer.

2. The display panel of claim 1, wherein the pixel comprises:
   a thin film transistor; and
   a display element electrically connected to the thin film transistor.

3. The display panel of claim 2, further comprising a spacer overlapping the thin film transistor,
   wherein the display element comprises a first electrode, a second electrode, and a display layer disposed between the first electrode and the second electrode, and
   the first electrode and the second electrode overlap each other and are spaced apart from each other in a thickness direction of the first substrate, the inorganic layer extends to overlap the thin film transistor, the second electrode overlaps the thin film transistor, and the spacer is disposed between a portion of the inorganic layer overlapping the thin film transistor and a portion of the second electrode overlapping the thin film transistor.

4. The display panel of claim 3, wherein the first insulating structure and the spacer comprise substantially the same material.

5. The display panel of claim 3, further comprising a color filter disposed between the first substrate and the first electrode and overlapping the first electrode.

6. The display panel of claim 5, wherein the inorganic layer extends to overlap the color filter and is in contact with the color filter.

7. The display panel of claim 6, wherein the organic layer and the color filter comprise substantially the same material.

8. The display panel of claim 2, wherein the signal line is disposed on substantially the same layer as a control electrode of the thin film transistor.

9. The display panel of claim 2, further comprising a seal disposed between the first substrate and the second substrate and spaced apart from the organic layer of the second insulating structure.

10. The display panel of claim 2, further comprising a floating electrode overlapping the signal line and the second insulating structure,
    wherein the floating electrode is disposed between the signal line and the organic layer of the second insulating structure.

11. The display panel of claim 10, wherein the floating electrode is disposed on substantially the same layer as an input electrode or an output electrode of the thin film transistor.

12. The display panel of claim 2, wherein the display element comprises:
    a first electrode;
    a second electrode insulated from the first electrode; and
    a light emitting layer disposed between the first electrode and the second electrode.

13. The display panel of claim 1, further comprising a circuit substrate electrically connected to the connection pad.

14. The display panel of claim 1, wherein the signal line comprises copper, and the connection pad comprises silver paste.

15. The display panel of claim 1, further comprising an insulating layer disposed between the first insulating structure and the second substrate.

16. The display panel of claim 15, wherein the first insulating structure contacts the insulating layer.

17. The display panel of claim 1, wherein the second insulating structure contacts the first insulating structure.

18. The display panel of claim 1, wherein the connection pad contacts the side surface of the first substrate and the side surface of the second insulating structure.

19. A display panel comprising:
    a first substrate having a top surface and a side surface;
    a second substrate facing the first substrate;
    electrodes disposed between the first substrate and the second substrate;
    a display layer disposed between the first substrate and the second substrate;
    a sealing structure disposed between the first substrate and the second substrate;
    an insulating structure disposed between the first substrate and the second substrate, wherein the insulating structure has a side surface substantially aligned with the side surface of the first substrate and includes layers different from that of the sealing structure;

a signal line having a side surface substantially aligned with the side surface of the first substrate, wherein the signal line is disposed on the first substrate and overlaps the insulating structure; and a connection pad being in contact with the side surface of the signal line, wherein the insulating structure is disposed outside of the sealing structure in a plan view and without overlapping the sealing structure in a plan view.

* * * * *